(12) United States Patent
Ito et al.

(10) Patent No.: US 6,296,104 B1
(45) Date of Patent: Oct. 2, 2001

(54) ELECTRONIC COMPONENT FEEDING APPARATUS

(75) Inventors: Tatsuichi Ito; Koji Saito; Taro Yasuda, all of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/207,578

(22) Filed: Dec. 8, 1998

(30) Foreign Application Priority Data

Dec. 9, 1997 (JP) ................................. 9-338688

(51) Int. Cl.$^7$ ................................................ B65G 47/14
(52) U.S. Cl. ................... 198/468.5; 198/396; 221/212
(58) Field of Search ........................ 198/383, 390, 198/396, 439, 468.5, 550.2; 221/212; 414/414

(56) References Cited

U.S. PATENT DOCUMENTS

| | | | |
|---|---|---|---|
| 4,061,094 | * 12/1977 | Cary et al. .......................... | 221/212 |
| 4,459,743 | * 7/1984 | Watanabe et al. ................... | 29/740 |
| 4,744,455 | * 5/1988 | Dragotta et al. .................... | 198/396 |
| 5,067,763 | * 11/1991 | Aoyama .............................. | 198/468.5 |
| 5,636,725 | * 6/1997 | Saito et al. ......................... | 198/396 |
| 5,836,437 | * 11/1998 | Saito et al. ......................... | 198/396 |
| 6,032,783 | * 3/2000 | Saito et al. ......................... | 198/396 |
| 6,073,800 | * 6/2000 | Saito et al. ......................... | 221/212 |
| 6,102,188 | * 8/2000 | Saito et al. ......................... | 198/459.7 |
| 6,116,840 | * 9/2000 | Saito et al. ......................... | 198/396 |
| 6,135,264 | * 10/2000 | Saito et al. ......................... | 198/396 |

FOREIGN PATENT DOCUMENTS 0 601 603 A1   6/1994   (EP).
6-232596       8/1994   (JP).

* cited by examiner

Primary Examiner—Douglas Hess
(74) Attorney, Agent, or Firm—Lowe Hauptman Gilman & Berner, LLP

(57) ABSTRACT

An electronic component feeding apparatus for separating a foremost electronic component conveyed to a predetermined takeout position from a succeeding electronic component, wherein, the separating device includes a first component stopper, a second component stopper projecting from the first component stopper and having a magnetic attractive force at a tip end thereof for separating a foremost electronic component. The second component stopper is movable within the first component stopper between a retracted and a protruding position so that the foremost electronic component engages both the first and second component stoppers during separation from a succeeding electronic component.

3 Claims, 24 Drawing Sheets

Fig. 19 (A)
| Permanent magnet | M1 | M2 | M3 | M4 | M5 |
|---|---|---|---|---|---|
| Top-face polarity | N | N | N | S | N |
| Surface magnetic field(G) | 2200 | 2200 | 2200 | 2200 | 2200 |
| Diameter(mm) | 1.8 | 1.6 | 2.0 | 3.0 | 3.0 |
Fig. 19 (B)
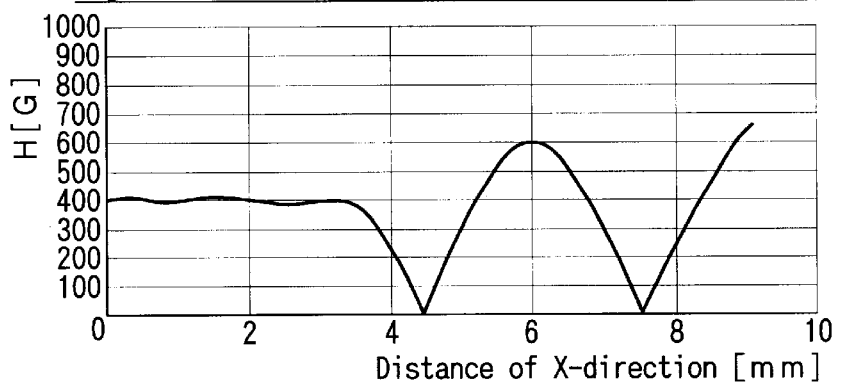
Fig. 20 (A)
| Permanent magnet | M1 | M2 | M3 | M4 | M5 |
|---|---|---|---|---|---|
| Top-face polarity | N | N | N | S | N |
| Surface magnetic field(G) | 3000 | 3000 | 3000 | 2200 | 2200 |
| Diameter(mm) | 1.8 | 1.6 | 2.0 | 3.0 | 3.0 |
Fig. 20 (B)
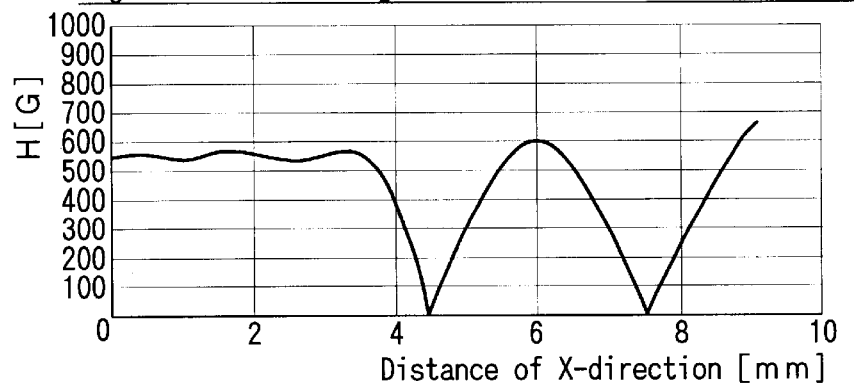

Fig. 21 (A)
| Permanent magnet | M1 | M2 | M3 | M4 | M5 |
|---|---|---|---|---|---|
| Top-face polarity | N | N | N | S | N |
| Surface magnetic field(G) | 2200 | 2200 | 2200 | 2200 | 2200 |
| Diameter(mm) | 2.0 | 2.0 | 2.0 | 3.0 | 3.0 |
Fig. 21 (B)
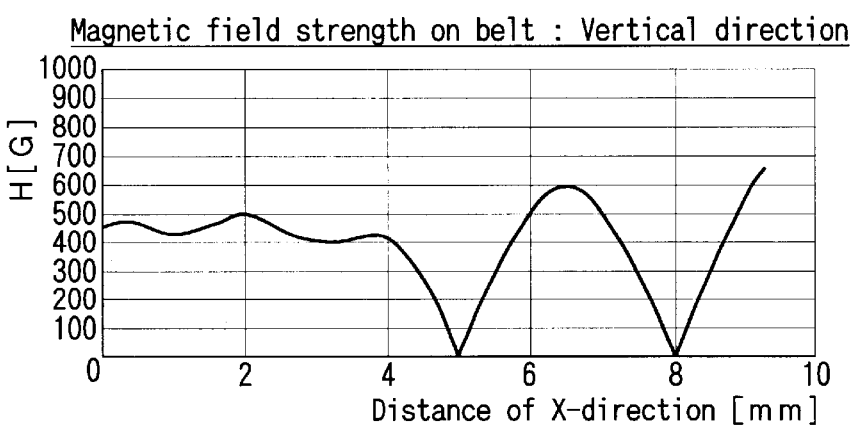
Fig. 22 (A)
| Permanent magnet | M1 | M2 | M3 | M4 | M5 |
|---|---|---|---|---|---|
| Top-face polarity | N | N | N | S | N |
| Surface magnetic field(G) | 2200 | 2200 | 2200 | 2200 | 2200 |
| Diameter(mm) | 3.0 | 3.0 | 3.0 | 3.0 | 3.0 |
Fig. 22 (B)
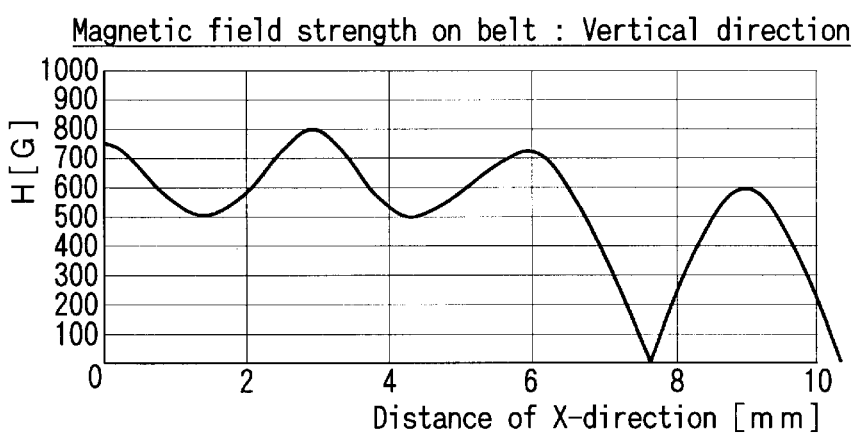

Fig. 23 (A)
| Permanent magnet | M1 | M2 | M3 | M4 | M5 |
|---|---|---|---|---|---|
| Top-face polarity | N | N | S | N | S |
| Surface magnetic field(G) | 2200 | 2200 | 2200 | 2200 | 2200 |
| Diameter(mm) | 1.8 | 2.0 | 3.0 | 3.0 | 3.0 |
Fig. 23 (B)
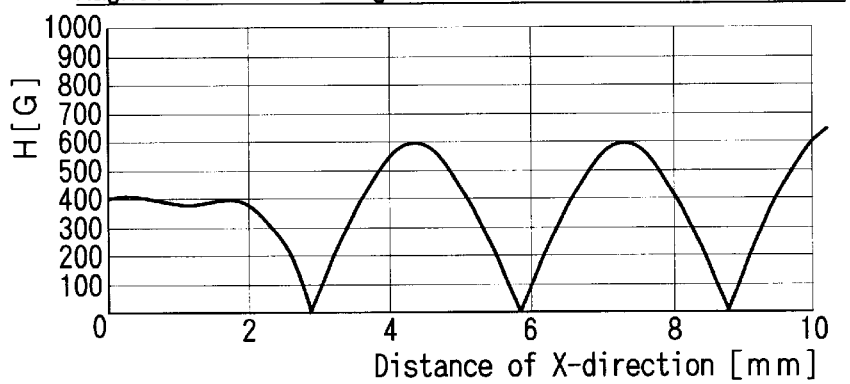
Fig. 24 (A)
| Permanent magnet | M1 | M2 | — | M4 | M5 |
|---|---|---|---|---|---|
| Top-face polarity | N | N | — | N | S |
| Surface magnetic field(G) | 2200 | 2200 | — | 2200 | 2200 |
| Diameter(mm) | 1.8 | 1.8 | — | 3.0 | 3.0 |
Fig. 24 (B)
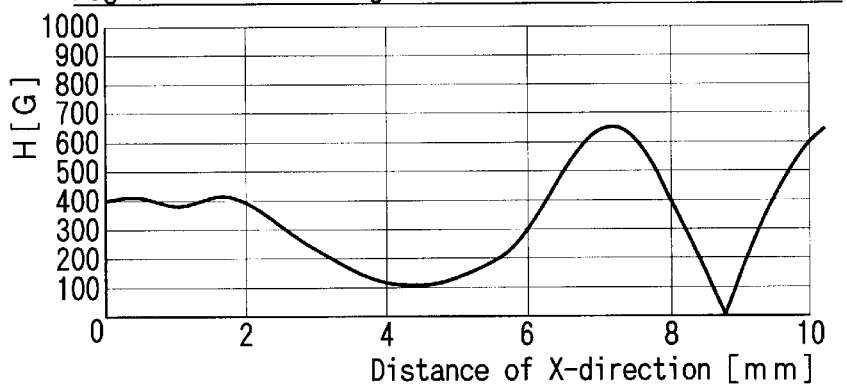

Fig. 25 (A)
| Permanent magnet | M1 | M2 | M3 | — | M5 |
|---|---|---|---|---|---|
| Top-face polarity | N | N | N | — | S |
| Surface magnetic field(G) | 2200 | 2200 | 2200 | — | 2200 |
| Diameter(mm) | 1.8 | 1.6 | 1.8 | — | 3.0 |
Fig. 25 (B)
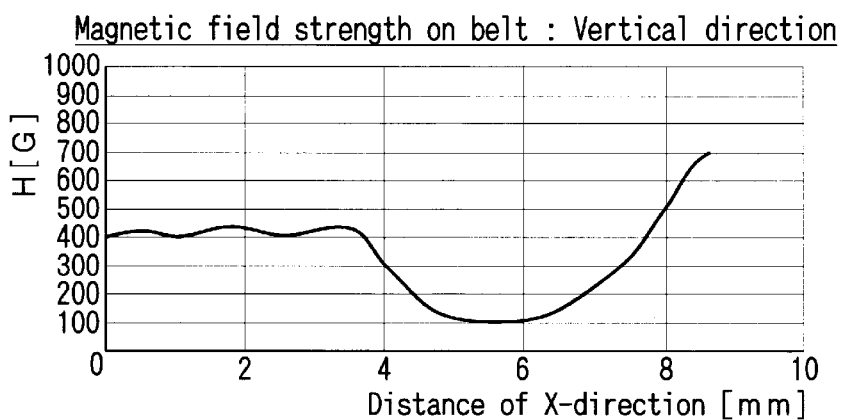
Fig. 26
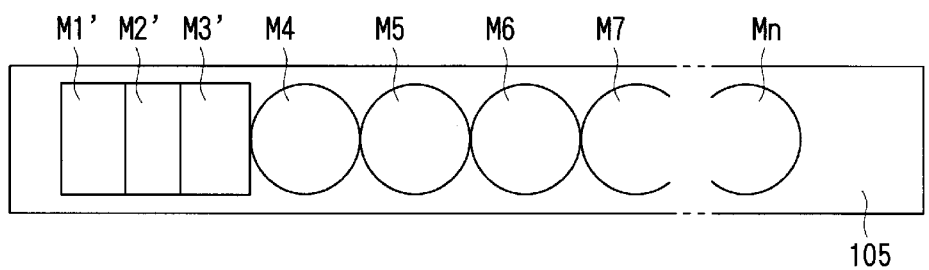

ELECTRONIC COMPONENT FEEDING APPARATUS

BACKGROUND OF THE INVENTION

1. Field of the Invention

The present invention relates to an electronic component feeding apparatus for conveying electronic components by intermittent movement of a belt.

2. Description of the Prior Art

Japanese Patent Application Laid-Open No. Heisei6-232596 has disclosed an apparatus for conveying chip components using a belt.

This apparatus has an endless belt wound around a pair of pulleys, a ratchet mechanism for intermittently moving a belt through a predetermined distance by driving one of the pulleys, and a lever mechanism for transmitting the power to the ratchet mechanism. When the power is transmitted to the ratchet mechanism by moving an operating portion of the lever mechanism in a predetermined direction, one pulley is turned through a predetermined angle in a predetermined direction by the ratchet mechanism, and the belt is moved through a predetermined distance in a predetermined direction by the turning of the pulley. Chip components, arranged in an orderly way on the belt, are conveyed in the same direction by the movement of the belt, and the foremost chip component is fed to a predetermined takeout position. The foremost chip component fed to the takeout position is taken out by using a suction nozzle. When the operating portion of the lever mechanism is moved again, the succeeding chip component is fed to the takeout position in the same way as described above.

The apparatus of this type has widely been used for a component mounter, component mounting line, and the like. In recent years, there has been demanded a mechanism which can respond to high-speed component takeout cycle, specifically a mechanism which can take out components in a very short cycle as short as 0.1 sec.

However, on the aforesaid apparatus, since the operating portion of the lever mechanism is directly connected to an driving portion of the ratchet mechanism, the speed at which the belt moves is substantially proportional to the speed at which the operating portion of the lever mechanism is moved. That is to say, if the operation speed of the operating portion of the lever mechanism is increased to respond to the high-speed component takeout cycle, the belt movement speed increases substantially proportionally, so that the chip components on the belt cannot follow the belt initial speed. Thereby, a slip occurs between the belt and the chip components on the belt, so that only the belt moves while the chip component is left, with the result that components cannot be conveyed satisfactorily by means of the belt.

SUMMARY OF THE INVENTION

An object of the present invention is to provide a new electronic component feeding apparatus which can properly convey components by using a belt even when a component takeout cycle becomes fast.

To achieve the above object, the electronic component feeding apparatus of the present invention comprises a belt for conveying electronic components, a belt moving mechanism for moving the belt by a predetermined distance based on a predetermined motion which is transmitted, and a motion changing mechanism for changing an input motion for moving the belt to an unequal speed motion having a low initial speed and for transmitting the changed unequal speed motion to the belt moving mechanism.

In this apparatus, even if the input motion is made fast to respond to high-speed component takeout cycle, the motion changing mechanism can change the input motion to an unequal speed motion having a low initial speed, and transmit the changed motion to the belt moving mechanism. Therefore, even if the speed of the input motion is increased, the initial speed of belt can be decreased by the motion change. Thereby, a slip produced between the belt and the electronic component is prevented, so that the components can be conveyed properly and stably by using the belt.

These and other objects, features, and advantages of the present invention will become more apparent by referring to the following description and accompanying drawings.

BRIEF DESCRIPTION OF THE DRAWINGS

FIG. 19(A) is a table showing experimental conditions of permanent magnets M1 to Mn, and FIG. 19(B) is a diagram showing an experimental result of a magnetic field strength thereof;

FIG. 20(A) is a table showing experimental conditions of permanent magnets M1 to Mn, and FIG. 20(B) is a diagram showing an experimental result of a magnetic field strength thereof;

FIG. 21(A) is a table showing experimental conditions of permanent magnets M1 to Mn, and FIG. 21(B) is a diagram showing an experimental result of a magnetic field strength thereof;

FIG. 22(A) is a table showing experimental conditions of permanent magnets M1 to Mn, and FIG. 22(B) is a diagram showing an experimental result of a magnetic field strength thereof;

FIG. 23(A) is a table showing experimental conditions of permanent magnets M1 to Mn, and FIG. 23(B) is a diagram showing an experimental result of a magnetic field strength thereof;

FIG. 24(A) is a table showing experimental conditions of permanent magnets M1 to Mn, and FIG. 24(B) is a diagram showing an experimental result of a magnetic field strength thereof;

FIG. 25(A) is a table showing experimental conditions of permanent magnets M1 to Mn, and FIG. 25(B) is a diagram showing an experimental result of a magnetic field strength thereof;

FIG. 26 is a view showing a modified example of shapes of permanent magnets M1 to Mn;

DESCRIPTION OF THE PREFERRED EMBODIMENTS

Figure 1:
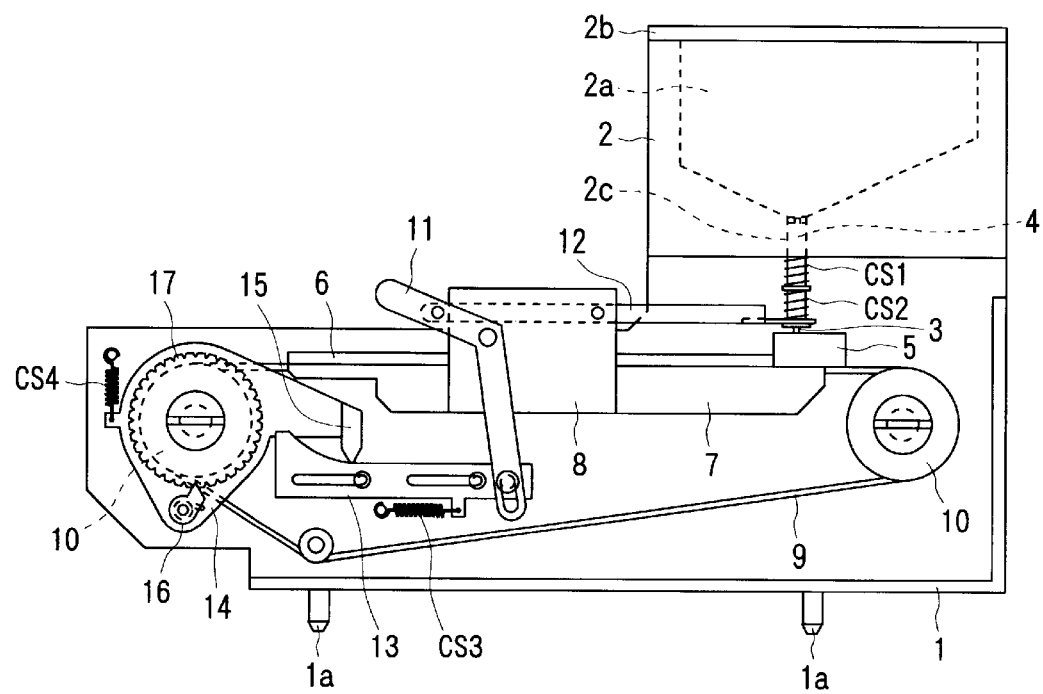
FIG. 1 is a side view of an electronic component feeding apparatus showing one embodiment of the present invention.
Figure 2:
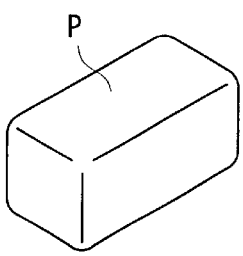
FIGS. 2(A) to 2(C) are views showing typical shapes of chip component handled by the apparatus shown in FIG. 1.
Figure 2:
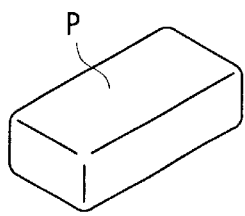
Figure 2:
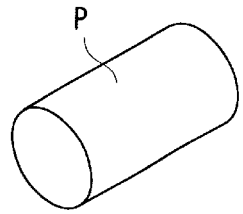

FIGS. 1 to 9 show one embodiment of the present invention. In FIGS. 1 to 9, reference numeral 1 denotes a frame, 2 denotes a hopper, 3 denotes a fixed pipe, 4 denotes a movable pipe, 5 denotes a first component guide, 6 denotes a second component guide, 7 denotes a belt guide, 8 denotes a bracket, 9 denotes a belt, 10 denotes a pair of front and rear pulleys, 11 denotes a control lever, 12 denotes a pipe driving lever, 13 denotes a cam member, 14 denotes a ratchet driving lever, 15 denotes a cam contact member, 16 denotes a ratchet, 17 denotes a ratchet wheel, CS1 to CS5 denote coil springs, P denotes a chip component, and AN denotes a section nozzle. In the following explanation, the right and left in FIG. 1 are described as the rear and front for convenience, respectively.

The frame 1 serves to support composing elements described later. On the bottom surface of this frame 1, two positioning pins 1a which can be inserted into holes (not shown) of a mating member such as a table are provided as shown in FIG. 1.

Figure 5:
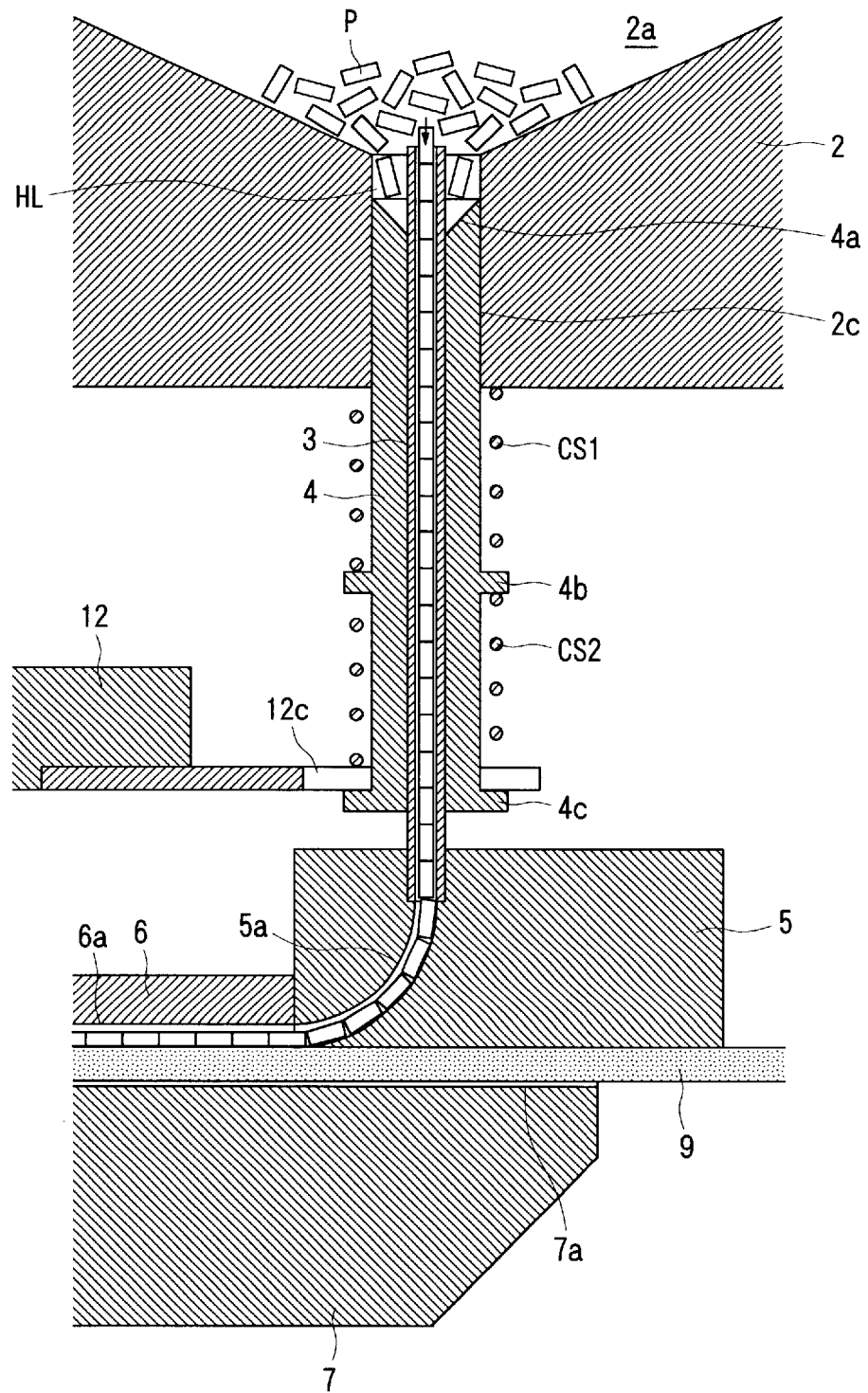
FIG. 5 is an enlarged longitudinal sectional view of a principal portion of the apparatus shown in FIG. 1.

The hopper 2 has, as shown in FIGS. 1 and 5, a storage chamber 2a, a cover 2b for covering the top opening of the storage chamber 2a so as to be opened and closed freely, and an insertion hole 2c for a movable pipe, which is formed so as to penetrate the bottom of the storage chamber 2a. The hopper 2 is removably attached to the frame 1. The insertion hole 2c basically has a circular transverse cross-sectional shape, but it may have a rectangular or other transverse cross-sectional shape. In the storage chamber 2a, one kind of many chip components P having a quadrangular prism or cylindrical shape as shown in FIGS. 2(A) to 2(C) such as a chip capacitor, a chip resistor, and a chip inductor are stored in a bulk state. Needless to say, an electronic component other than the chip component, for example, a composite component such as a LC filter and a network, and an integrated circuit component such as a semiconductor device can be handled if they have the same shape as described above.

The fixed pipe 3 is made of a metallic pipe material or a rigid resin pipe material with a given length. As shown in FIG. 5, the fixed pipe 3 is fixed to the first component guide 5 at the lower end thereof, and inserted vertically in the central position of the insertion hole 2c so that the upper end thereof agrees substantially with the upper end of the insertion hole 2c. The wall thickness of the fixed pipe 3 is smaller than the maximum length of the end face of the chip component P being fed. The upper end inner edge of the fixed pipe 3 is rounded or chamfered as necessary to prevent the chip component P from being caught. The inner hole of the fixed pipe 3 has a rectangular or circular transverse cross-sectional shape slightly larger than the end face shape of the chip component P. Accordingly, the chip components P in the storage chamber 2a are taken in the upper end opening of the fixed pipe 3 one by one in the lengthwise direction, and moved downward in the fixed pipe 3 by gravity in the same direction.

The movable pipe 4 is made of a metallic pipe material or rigid resin pipe material with a given length having an external shape slightly smaller than the insertion hole 2c and an internal shape slightly larger than the fixed pipe 3. As shown in FIG. 5, the movable pipe 4 is disposed in an annular gap formed between the insertion hole 2c and the fixed pipe 3 so as to be capable of moving vertically in such a manner that the upper end thereof is slightly lower than the upper end of the insertion hole 2c in the descending state. The wall thickness of the movable pipe 4 is larger than the maximum length of the end face of the chip component P being fed. Also, at the upper end of the movable pipe 4, a cone-shaped guide face 4a tilting downward toward the pipe center is provided. Further, two collars 4b and 4c are formed on the external face of the movable pipe 4, and the coil springs CS1 and CS2 having a force relationship of CS1<CS2 are mounted above and below the upper collar 4b.

The first component guide 5 has, as shown in FIG. 5, a curved passage 5a, having a transverse cross-sectional shape agreeing substantially with the inner hole of the fixed pipe 3, therein. The curved passage 5a is curved from the vertical direction to the horizontal direction in the range of about 90 degrees with a fixed curvature viewed from the side. This first component guide 5 is removably attached to the frame 1 or the belt guide 7 so that the upper end of the curved passage 5a is continuous with the inner hole of the fixed pipe 3.

Figure 3:
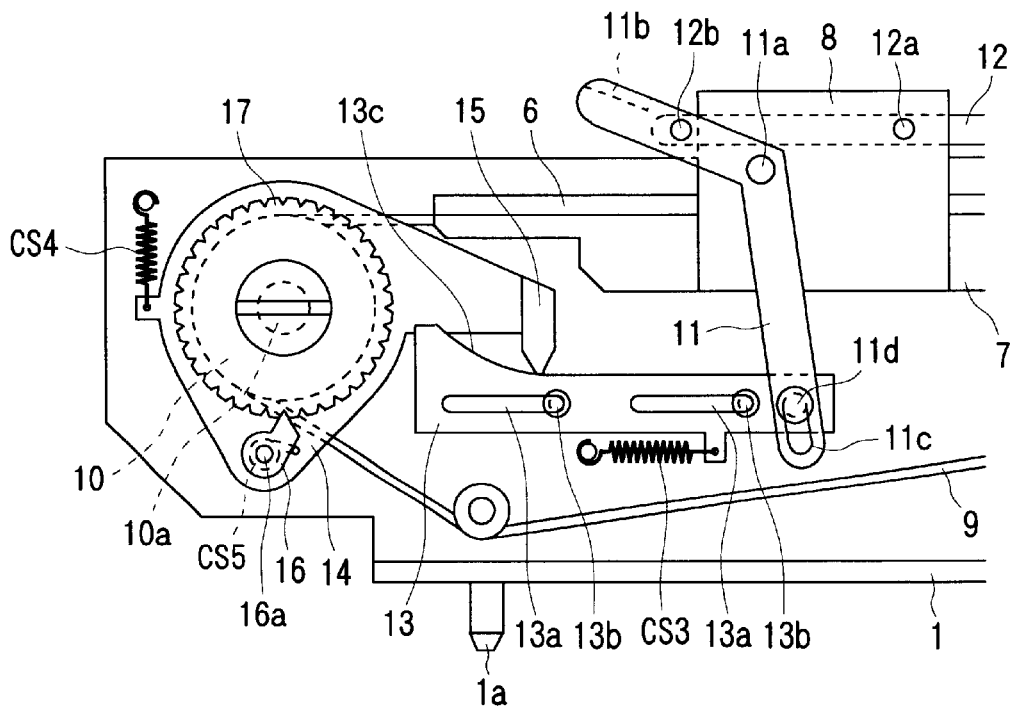
FIG. 3 is an enlarged view of a principal portion of the apparatus shown in FIG. 1.
Figure 4:
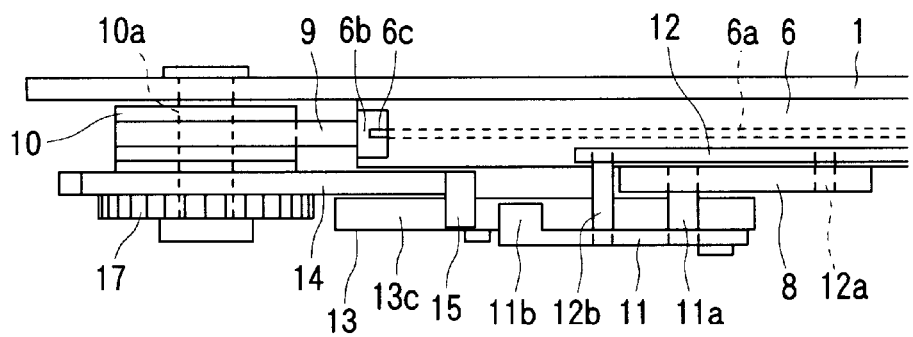
FIG. 4 is a top view of FIG. 3.

The second component guide 6 has, as shown in FIGS. 3 to 5, a straight guide groove 6a for guiding the chip components P conveyed by the belt 9 on the lower surface thereof. The guide groove 6a basically has a rectangular transverse cross-sectional shape slightly larger than the end face shape of the chip component P, but it may have another cross-sectional shape if it can guide the chip components P arranged in one line. This second component guide 6 is removably attached to the frame 1 or the belt guide 7 so that the rear end of the guide groove 6a is continuous with the front end of the aforesaid curved passage 5a. Also, at the front end of the guide groove 6a, there are provided a component stopper portion 6b (see FIGS. 9(A) and 9(B)) for stopping the conveyed component P and a component take-out port 6c (see FIGS. 9(A) and 9(B)) for taking out the foremost chip component P from the guide groove 6a to the outside.

The belt guide 7 has, as shown in FIG. 5, a straight guide groove 7a having a width and depth slightly larger than the width and thickness of the belt 9, respectively, on the upper surface thereof. This belt guide 7 is disposed under the first and second component guides 5 and 6 so that the center of the guide groove 7a in the width direction agrees with the center of the aforesaid guide groove 6a in the width direction, and removably attached to the frame 1. Also, at the side of the belt guide 7, the bracket 8 is attached to support the control lever 11 and the pipe driving lever 12.

The belt 9 consists of a non-magnetic endless timing belt or an endless flat belt formed of synthetic rubber, soft resin, or the like material. As shown in FIG. 1, this belt 9 is wound around the paired pulleys 10, which are rotatably supported by the frame 1 at the front and rear positions of the belt guide 7, with a predetermined tension. Also, the upper portion of the belt 9 between the pulleys 10 is positioned in the guide groove 7a of the belt guide 7, and comes into contact movably with the lower surfaces of the first and second component guides 5 and 6 with the winding tension.

The control lever 11 has, as shown in FIGS. 1, 3 and 4, a bent portion attached rotatably to the bracket 8 via a shaft 11a. Also, at the upper end of the control lever 11, a control portion 11b pressed downward by a portion moving in connection with the suction nozzle AN (see FIG. 9(A)) or other driving device (not shown) is provided. Further, an elongated hole 11c is formed at the lower end of the control lever 11, and the elongated hole 11c is connected to the rear end of the cam member 13 via a guide pin 11d.

The pipe driving lever 12 has, as shown in FIGS. 1, 3 and 4, a substantially central portion attached rotatably to the bracket 8 via a shaft 12a. The front end of the pipe driving lever 12 is rotatably attached to the control lever 11 via a shaft 12b. Also, as shown in FIG. 5, at the rear end of the pipe driving lever 12, an engagement portion 12c consisting of a U-shaped portion or around hole is provided. This engagement portion 12c is mounted between the lower collar 4c of the movable pipe 4 and the lower coil spring CS2. The pipe driving lever 12 is turned around the shaft 12a in the counterclockwise direction in FIG. 1 by turning the aforesaid control lever 11 in the same direction.

The cam member 13 has, as shown in FIGS. 1, 3 and 4, two elongated holes 13a at an interval in the longitudinal direction, so that it can be moved straight in the longitudinal direction while being guided by guide pins 13b fixed to the frame 1 through the elongated holes 13a. Also, a cam face 13c, consisting of a concave curved face, is provided on the front side of the upper face of the cam member 13. Further, the cam member 13 is urged forward by a coil spring CS3 installed between the cam member 13 and the frame 1. The return position of the aforesaid control lever 11 is regulated by the mutual contact between the elongated hole 13a and the guide pin 13b. Needless to say, the return position of the control lever 11 may be regulated by other part.

The ratchet driving lever 14 is, as shown in FIGS. 1, 3 and 4, rotatably attached to a shaft 10a supporting the front pulley 10. Also, at a rear projecting portion of the ratchet driving lever 14, the cam contact member 15 having a rounded lower end is provided separately or integrally. This ratchet driving lever 14 is urged in the clockwise direction in FIG. 1 by a coil spring CS4 installed between the ratchet driving lever 14 and the frame 1, so that the lower end of the cam contact member 15 comes into contact with the aforesaid cam face 13c. Further, at a lower projecting portion of the ratchet driving lever 14, the ratchet 16 having a sharp portion is rotatably attached via a shaft 16a. This ratchet 16 is urged in the counterclockwise direction in FIG. 1 by a coil spring CS5 installed between the ratchet 16 and the ratchet driving lever 14, so that the sharp portion engages with one groove of the ratchet wheel 17.

The ratchet wheel 17 is, as shown in FIGS. 1, 3 and 4, fixed to the front pulley 10 so that the mutual rotation centers agree with each other, so that it turns along with the front pulley 10. On the outer peripheral surface of the ratchet wheel 17, a plurality of V-shaped grooves are provided with a predetermined angular pitch.

In this embodiment, a component discharge mechanism is configured in which the chip components P in the component storage chamber 2a are taken one by one in a predetermined direction and discharged onto the belt 9 by using the fixed pipe 3, the movable pipe 4, the curved passage 5a of the first component guide 5, and the pipe driving lever 12.

Also, in this embodiment, a motion change mechanism is configured in which an input motion is changed to an unequal speed motion having a low initial speed by using the cam member 13 and the cam contact member 15. The power for moving the belt is transmitted from the control lever 11 to the belt driving lever 14 via this motion change mechanism. The power transmitting method and the motion changing method by this motion change mechanism will be made apparent in the later explanation.

The following is a description of the operation of the aforesaid electronic component feeding apparatus.

Figure 6:
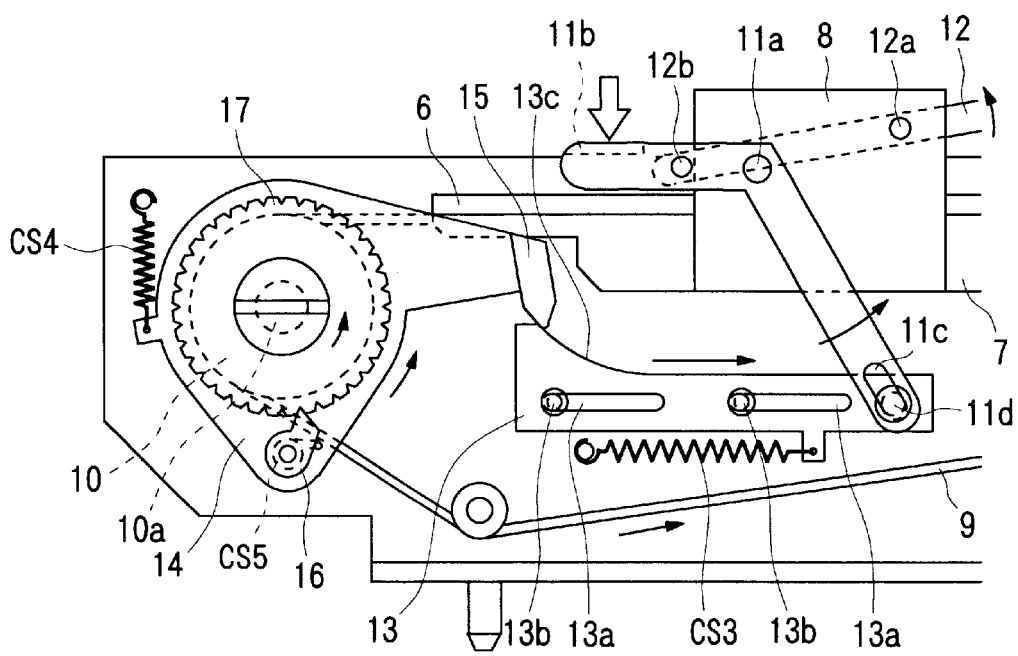
FIG. 6 is a view for illustrating a motion of the apparatus shown in FIG. 1, corresponding to FIG. 3.

The control portion 11b of the control lever 11 is pressed downward through a predetermined distance by a portion moving in connection with the suction nozzle AN or other driving device (not shown) as shown in FIG. 6, when the foremost chip component P is taken out through the component takeout port 6c in a predetermined cycle by the suction nozzle AN (see FIG. 9(A)). It is to be noted that the pressing distance of the control portion 11b can be controlled on the apparatus side if the rotation limit position of the control lever 11 is regulated by a stopper pin or the like.

When the movable pipe 4 is at the descending position, an annular concave portion HL is formed between the upper end of the movable pipe 4, the inner surface of the insertion hole 2c, and the outer surface of the fixed pipe 3 as shown in FIG. 5, so that a small number of chip components P enter this annular concave portion HL.

When the control portion 11b of the control lever 11 is pressed downward through the predetermined distance in this state in the same manner as described above, the control lever 11 is turned around the shaft 11a counterclockwise through a predetermined angle against the urging force of the coil spring CS3 as shown in FIG. 6. Also, the pipe driving lever 12 is turned around the shaft 12a counterclockwise through a predetermined angle by the turning of the control lever 11. By the turning of the pipe driving lever 12, as shown in FIG. 8, the movable pipe 4 rises from the descending position through a predetermined distance against the urging force of the coil spring CS1, so that the upper end thereof enters the storage chamber 2a.

Figure 8:
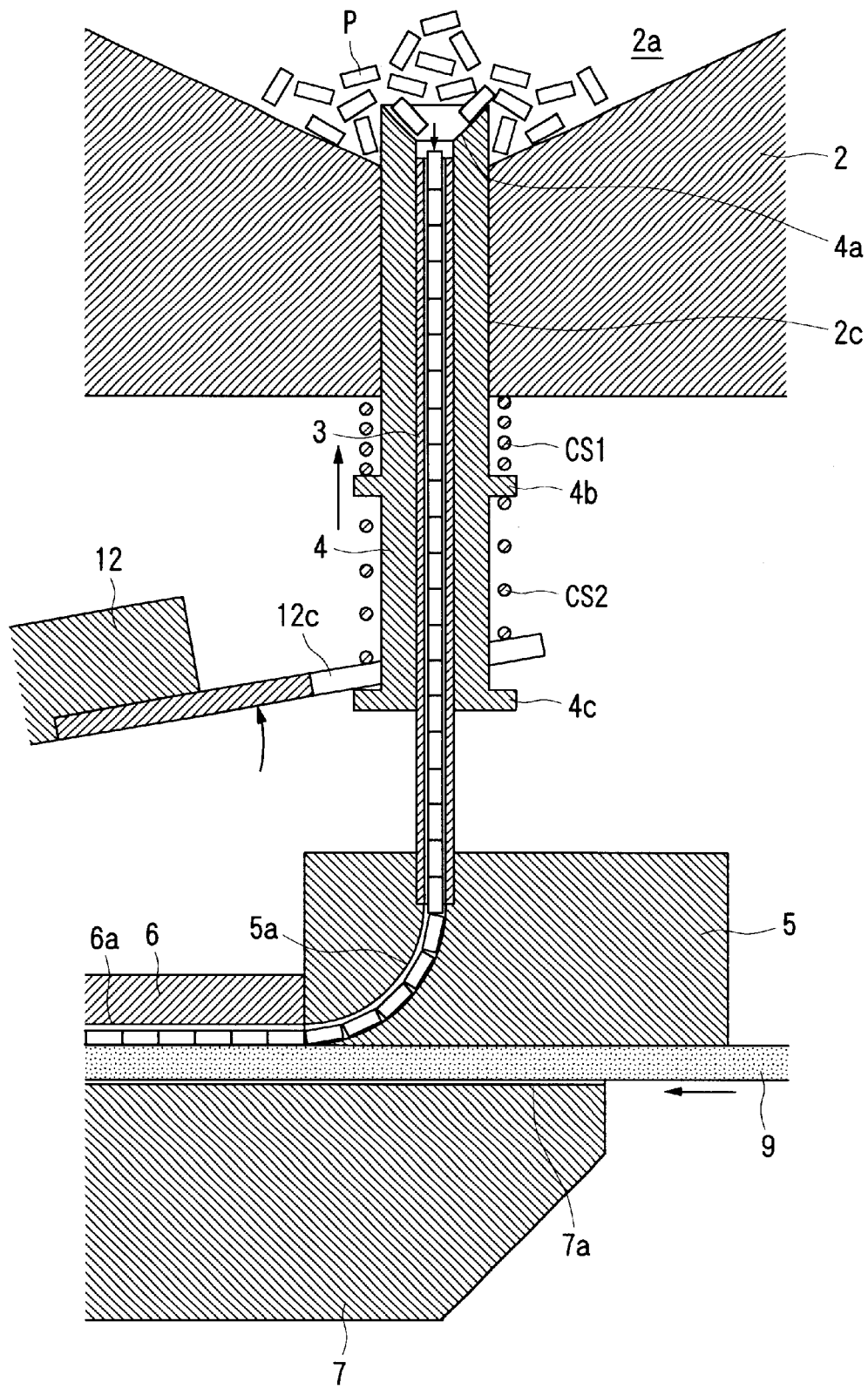
FIG. 8 is a view for illustrating the motion of the apparatus shown in FIG. 1, corresponding to FIG. 5.
Figure 9:
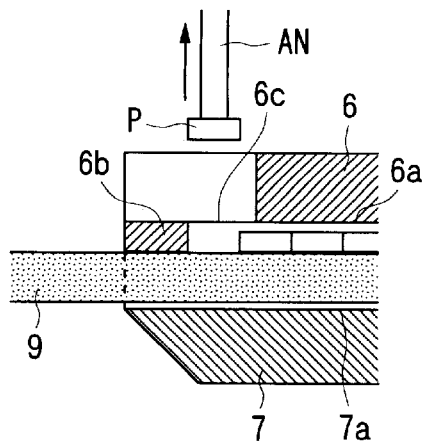
FIGS. 9(A) and 9(B) are longitudinal sectional views of the principal portions showing a component takeout motion and a component stop motion, respectively.
Figure 9:
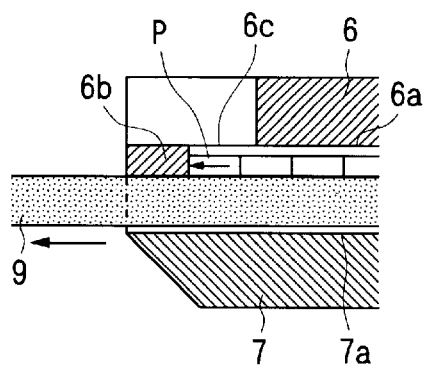

In the process in which the movable pipe 4 moves from the descending position to the ascending position, as shown in FIG. 8, the chip components P in the annular concave portion HL are raised upward, and at the same time, the chip components P in the storage chamber 2a are subjected to a disentangling action. If there are chip components P lying on the fixed pipe 3, these chip components P are pushed away by the rising movable pipe 4. In this process, the chip components P in the storage chamber 2a are taken in the upper end opening of the fixed pipe 3 one by one in the lengthwise direction through the guide face 4a of the movable pipe 4 or directly. The chip component P taken into the fixed pipe 3 moves downward in the fixed pipe 3 in the lengthwise direction by gravity.

When the pressure on the control portion 11b is released after the control lever 11 is turned through the predetermined angle, the control lever 11 is returned to the original position by the urging force of the coil spring CS3 (see FIG. 3). With the return of the control lever 11, the pipe driving lever 12 is also returned to the original position (see FIG. 3). By the return of the pipe driving lever 12, the movable pipe 4 is returned to the original position while using the urging force of the coil spring CS1 (see FIG. 5).

In the process in which the movable pipe 4 moves from the ascending position to the descending position, as shown in FIG. 5, a small number of chip components P enter the annular concave portion HL again, and all of the stored components lower. In this process as well, like the aforesaid rising process, the chip components P in the storage chamber 2a are taken in the upper end opening of the fixed pipe 3 one by one in the lengthwise direction through the guide face 4a of the movable pipe 4 or directly. The chip component P taken into the fixed pipe 3 moves downward in the fixed pipe 3 in the lengthwise direction by gravity.

Thus, the chip components P are taken in the fixed pipe 3 in both of the rising process and the lowering process of the movable pipe 4. The chip components P taken in the upper end opening of the fixed pipe 3 one by one in the lengthwise direction move downward in the fixed pipe 3 in the lengthwise direction by gravity, and enter the curved passage 5a under the fixed pipe 3. The chip component P entering the curved passage 5a changes its posture by about 90 degrees from vertical to horizontal in the process in which it moves in the curved passage 5a along its curvature by gravity. Then, the posture-changed chip component P is discharged onto the belt 9 (see FIGS. 5 and 8).

On the other hand, when the control portion 11b of the control lever 11 is pressed downward through the predetermined distance, the cam member 13 is moved rearward through a predetermined distance by the turning of the control lever 11 as shown in FIG. 6. By the movement of the cam member 13, the cam contact member 15 in contact with the cam face 13c is pushed up gradually along the cam face shape. Thereby, the ratchet driving lever 14 is turned around the shaft 10a counterclockwise through a predetermined angle against the urging force of the coil spring CS4.

In the process in which the ratchet driving lever 14 is turned counterclockwise from the standby position through the predetermined angle, as shown in FIG. 6, the ratchet wheel 17 with which the ratchet 16 engages is turned along with the ratchet driving lever 14 in the same direction through the same angle, so that the front pulley 10 is also turned in the same direction through the same angle. Thereby, the belt 9 is moved forward through a distance corresponding to the turning angle of the front pulley 10, preferably through a distance slightly larger than the length of the chip component P. By the movement of the belt 9, the chip components P discharged from the curved passage 5a onto the belt 9 are moved forward through the same distance along with the belt 9.

The forward movement of the belt 9 is repeated each time the foremost chip component P is taken out through the component takeout port 6c in the predetermined cycle. Therefore, the chip components P are discharged in succession from the curved passage 5a onto the belt 9 each time the belt 9 moves forward. The chip components P discharged in succession are moved forward in succession in a state of being arranged in one line while being subjected to an aligning action by the guide groove 6a of the second component guide 6. The chip components P conveyed forward in line are stopped when the foremost chip component P comes into contact with the component stopper portion 6b of the second component guide 6, and the succeeding chip components P are ranged in one line behind the foremost chip component P without a gap (see FIG. 9(B)). When the movement amount of the foremost chip component P before it comes into contact with the component stopper portion 6b is smaller than the movement amount of one cycle of the belt 9, only the belt 9 moves while slipping under the chip components P by the difference in the movement amount between them even after the foremost chip component P comes into contact with the component stopper portion 6b.

When the pressure on the control portion 11b is released after the control lever 11 is turned through the predetermined angle, the control lever 11 and the cam member 13 are returned to the original positions by the urging force of the coil spring CS3 (see FIG. 3). With the return of the cam member 13, the ratchet driving lever 14 is also returned to the original position by the urging force of the coil spring CS4 (see FIG. 3). When the ratchet driving lever 14 is turned clockwise in FIG. 3, the ratchet 16 moves so as to slip on the outer peripheral surface of the ratchet wheel 17. Therefore, the ratchet wheel 17 and the front pulley 10 maintain the aforesaid turning position without being turned reversely.

As shown in FIGS. 9(A) and 9(B), the foremost chip component P is taken out by using the suction nozzle AN by lowering the suction nozzle AN toward the foremost chip component P exposed to the component takeout port 6c and by raising the suction nozzle AN after suction of the component in a state in which the foremost chip component P is in contact with the component stopper portion 6b of the second component guide 6.

As is seen from the above description, in the apparatus of this embodiment, when the control portion 11b of the control lever 11 is pressed downward, the cam member 13 is moved straight rearward by using the turning action of the control lever 11, and the cam contact member 15 in contact with the cam face 13c is pushed up by using the straight movement of the cam member 13, by which the power for moving the belt 9 is transmitted to the ratchet driving lever 14.

Figure 7:
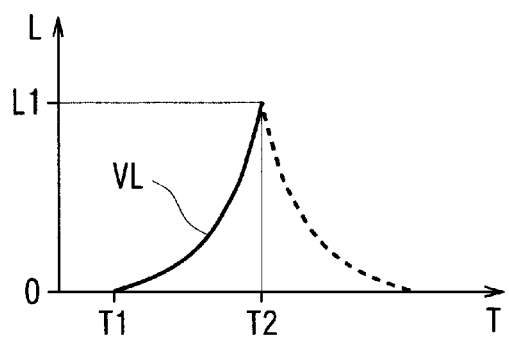
FIG. 7 is a diagram showing a motion speed of a ratchet driving lever (belt)

Since the cam face 13c of the cam member 13 has a shape shown in FIG. 3, even when the pressing action (input motion for moving the belt) given to the control portion 11b of the control lever 11 is an equal speed motion, an unequal speed motion having a low initial speed corresponding to the speed curve VL in FIG. 7, specifically an accelerated motion in which the speed increases gradually, and preferably a uniformly accelerated motion is given to the ratchet driving lever 14 and the front pulley 10, that is, the belt 9. Incidentally, in FIG. 7, the abscissae T represent time, and the ordinates L represent distance, and T1 is a pressing start point, T2 is a pressing end point, and the distance of 0 to L1 represents a belt movement distance.

That is to say, even if the speed of the input motion given to the control portion 11b of the control lever 11 is increased to respond to the high-speed component takeout cycle, a slip is not produced between the belt 9 and the chip component P on the belt 9 when the belt 9 begins to be moved. Thereby, a phenomenon that only the belt 9 moves while the chip components P are left is surely prevented, so that components can be conveyed properly and stably by using the belt 9. As a result, the takeout of components in a cycle not more than 0.1 sec can be achieved satisfactorily.

Figure 10:
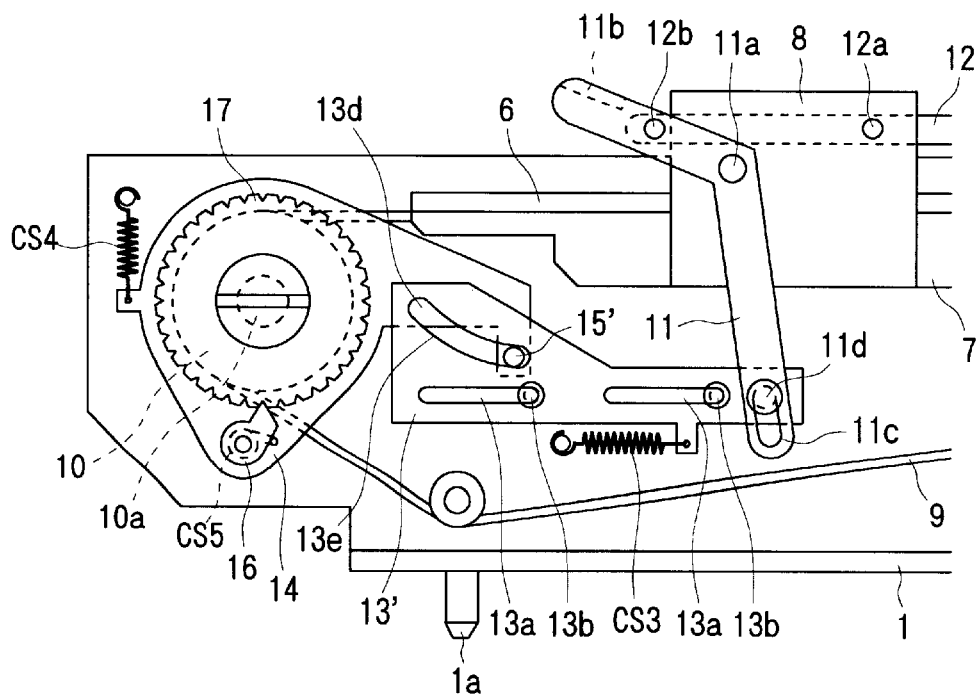
FIG. 10 is a side view of a principal portion of an electronic component feeding apparatus showing another embodiment of the present invention.

FIG. 10 shows another embodiment of the present invention. This embodiment differs from the embodiment shown in FIGS. 1 to 9 in that the inner face of a curved elongated hole 13d formed in a cam member 13' is used as a cam face 13e and that a pin-shaped cam contact member 15' inserted in the elongated hole 13d is provided on the rear projecting portion of the ratchet driving lever 14. Other configurations are the same as those of the embodiment shown in FIGS. 1 to 9, so that the same reference numerals are applied and the explanation thereof is omitted.

In this embodiment as well, like the embodiment shown in FIGS. 1 to 9, when the control portion 11b of the control lever 11 is pressed down, the cam member 13' is moved straight in the rearward direction by using the turning of the control lever 11, and the cam contact member 15' in contact with the cam face 13e is pushed up by using the straight movement of this cam member 13', by which the power for moving the belt 9 can be transmitted to the ratchet driving lever 14.

Since the cam face 13e of the cam member 13' has a shape shown in FIG. 10, even when the pressing action (input motion for moving the belt) given to the control portion 11b of the control lever 11 is an equal speed motion, an unequal speed motion having a low initial speed corresponding to the speed curve VL in FIG. 7, specifically an accelerated motion in which the speed increases gradually, and preferably a uniformly accelerated motion is given to the ratchet driving lever 14 and the front pulley 10, that is, the belt 9.

That is to say, even if the speed of the input motion given to the control portion 11b of the control lever 11 is increased to respond to the high-speed component takeout cycle, a slip is not produced between the belt 9 and the chip component P on the belt 9 when the belt 9 begins to be moved. Thereby, a phenomenon that only the belt 9 moves while the chip components P are left is surely prevented, so that components can be conveyed properly and stably by using the belt 9. As a result, the takeout of components in a cycle not more than 0.1 sec can be achieved satisfactorily.

In the embodiments shown in FIGS. 1 to 9 and FIG. 10, there have been shown a configuration in which the cam contact member 15 and 15' comes into direct contact with the cam face 13c and 13e, but a roller may be attached rotatably to the cam contact member 15 and 15', and this roller may be brought into contact with the cam face 13c and 13e. In this case, the resistance is reduced when the cam contact member 15 and 15' moves along the cam face 13c and 13e, so that the movement when the motion changes can be made smooth.

Also, although the cam faces 13c and 13e consisting of a concave curved face have been shown in the embodiments shown in FIGS. 1 to 9 and FIG. 10, a convex curved face or other shape may be used as a cam face if the same motion change as described above can be made. Needless to say, the same motion change may be made by using a mechanism other than the aforesaid motion change mechanism consisting of the cam member and the cam contact member.

Figure 11:
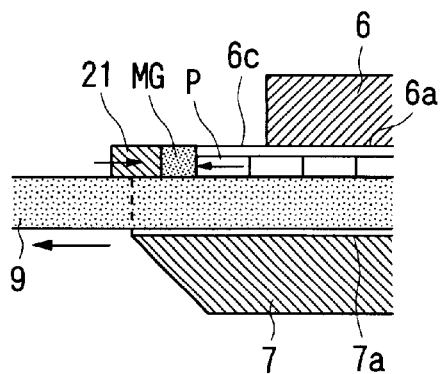
FIGS. 11(A) to 11(C) are views showing an example using a movable stopper and for illustrating a motion thereof.
Figure 11:
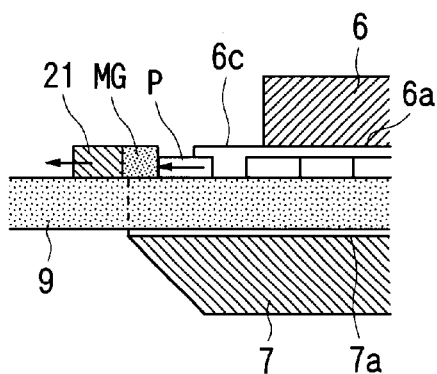
Figure 11:
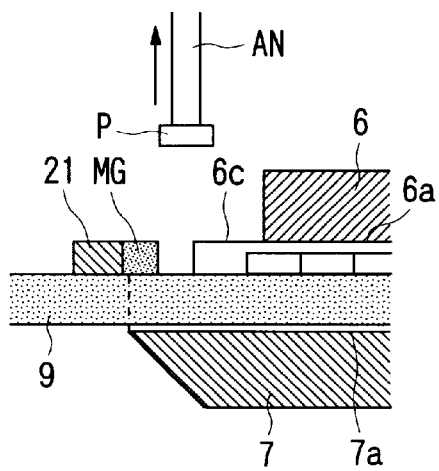

Further, in the embodiments shown in FIGS. 1 to 9 and FIG. 10, there has been shown a configuration in which the conveyed component P is stopped by abutting on the component stopper portion 6b of the second component guide 6, but a movable component stopper 21 as shown in FIGS. 11(A) to 11(C) may be used in place of the component stopper portion 6b. This component stopper 21 is disposed on the front side of the second component guide 6 excluding the component stopper portion 6b in such a manner as to be capable of being turned in a state in parallel to the belt surface or capable of being moved in parallel in the longitudinal direction. At the opposed portion of the component stopper 21, a permanent magnet MG such as a rare earth permanent magnet is provided so that the N pole face or the S pole face thereof faces the front end face of the foremost chip component P. Since any electronic component such as the chip component has an external electrode, internal conductor, or the like, it can be attracted to the permanent magnet MG.

According to this construction, the component stopper 21 is brought into contact with the front end of the second component guide 6 when the belt 9 moves forward (see FIG. 11(A)), and the component stopper 21 is displaced forward when or just after the movement of the belt 9 is stopped (see FIG. 11(B)). Then, the foremost chip component P is moved forward together with the component stopper 21 while being attracted by the magnetic force of the permanent magnet MG, by which it can be separated from the succeeding chip component P. If a configuration is used in which the aforesaid motion of the component stopper 21 can be achieved by using the movement of the control lever 11, cam meer 13 and 13', and the ratchet driving lever 14, the foremost chip component P can be taken out properly and stably without interference with the succeeding chip component P. If an air suction hole is formed in the component stopper 21 in place of the permanent magnet MG, the same operation can be achieved.

Figure 12:
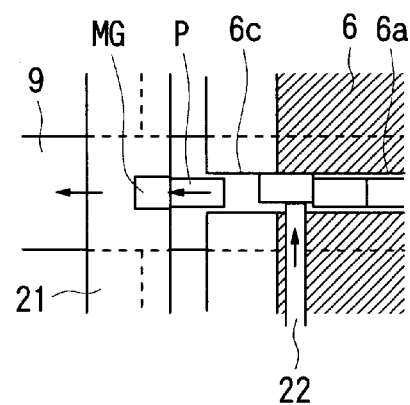
FIG. 12 is a view showing an example using a pin for retaining a succeeding component.

Further, as shown in FIG. 12, a component retaining pin 22, which can be projected and retracted, is provided in the guide groove 6a of the second component guide 6 so that the succeeding chip component P can be retained by this component retaining pin 22 when the component stopper 21 is moved forward. This configuration prevents a phenomenon that the succeeding chip component P is moved by being pulled to the foremost chip component P. If an air suction hole, spring member, or the like is used in place of the component retaining pin 22, the same operation can be achieved.

Next, constructions effective in conveying electronic components by using a belt will be described with reference to FIGS. 13 to 26.

In FIGS. 13 to 26, reference numeral 101 denotes a component guide, 102 denotes a belt, 103 denotes a belt guide, 104 denotes a component stopper, 105 denotes a magnet support plate, P denotes a chip component, and AN denotes a suction nozzle. In the following explanation, the right and left in FIG. 13 are described as the rear and front for convenience, respectively.

The chip component P is a chip component such as a chip capacitor, a chip resistor, and a chip inductor, having a quadrangular prism shape as shown in FIG. 2(A) or 2(B). Needless to say, the cylindrical chip components as shown in FIG. 2(C), an electronic component other than the chip component, for example, a composite component such as a LC filter and a network, and an integrated circuit component such as a semiconductor device can be handled. Since any electronic component such as the chip component has an external electrode, internal conductor, or the like, it can be attracted to a permanent magnet described later.

Figure 13:
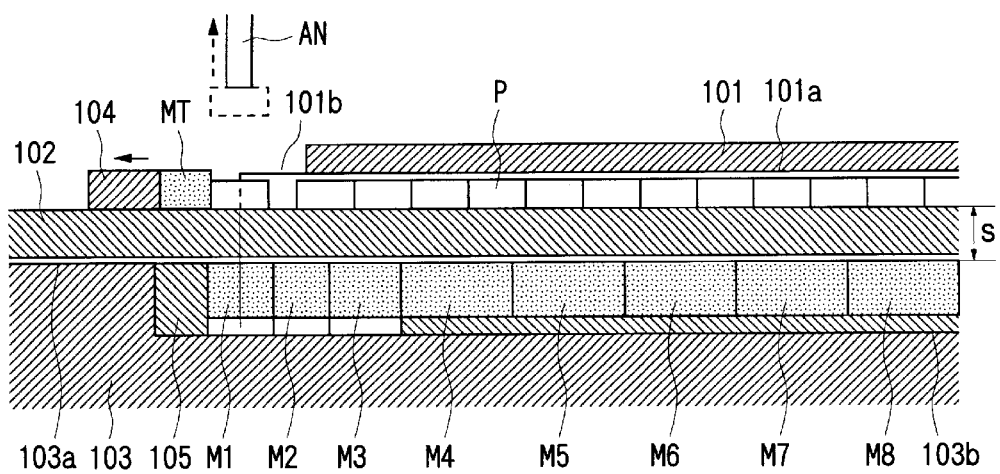
FIG. 13 is a partial longitudinal sectional view of an apparatus showing a construction effective in conveying electronic components by means of a belt.
Figure 14:
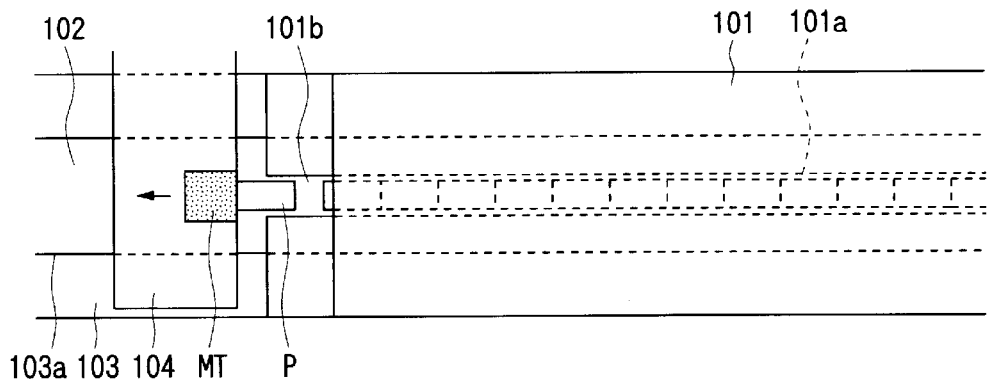
FIG. 14 is a top view of FIG. 13.

The component guide 101 has, as shown in FIGS. 13 and 14, a straight guide groove 101a for guiding chip components P conveyed by the belt 102 on the lower surface thereof. The guide groove 101a basically has a rectangular transverse cross-sectional shape slightly larger than the end face shape of the chip component P, but it may have another cross-sectional shape if it can guide the chip components P arranged in one line. Also, at the front end of the component guide 101, there is provided a component takeout port 101b for taking out the foremost chip component P to the outside.

The belt 102 consists, as shown in FIGS. 13 and 14, of an endless timing belt or an endless flat belt made of synthetic rubber, soft resin, or the like material. This belt 102 allows the passage of magnetic flux of the later-described permanent magnets M1 to Mn. Although omitted in these figures, the belt 102 is wound around a pair of pulleys disposed at the front and rear positions of the belt guide 103, and the upper portion thereof between the pulleys is in contact with the lower surface of the component guide 101 in a state of being movable. Also, the belt 102 can be moved intermittently by using a belt moving mechanism (not shown) such as a ratchet mechanism. The distance of one movement of the belt 102 is slightly larger than the length of the chip component P.

Although omitted in these figures, like the apparatus shown in FIGS. 1 to 9, a component storage chamber for storing many chip components P in a bulk state is disposed at the rear of the component guide 101. The chip components P in the component storage chamber are discharged in succession onto the belt 102 through a component discharge mechanism including a straight passage, curved passage, and the like.

The belt guide 103 has, as shown in FIGS. 13 and 14, a straight guide groove 103a having a width and depth slightly larger than the width and thickness of the belt 102 on the upper surface thereof. This belt guide 103 is disposed under the component guide 101 so that the center of the guide groove 103a in the width direction agrees with the center of the guide groove 101a in the width direction. The upper portion of the belt 102 is positioned in the guide groove 103a. Also, at the center of the bottom surface of the guide groove 103a in the width direction, a concave 103b for mounting a magnet support plate 105 is provided along the guide groove 103a.

The component stopper 104 consists, as shown in FIGS. 13 and 14, of a non-magnetic rectangular plate having a thickness substantially equal to the depth of the guide groove 101a. This component stopper 104 can be turned or moved in parallel in connection with the motion of the belt movement mechanism. The component stopper 104 shown in the figures reciprocates between a component stop position abutting on the front end of the component guide 101 (see FIGS. 15 and 16) and a component takeout position separated forward from the front end of the component guide 101 (see FIGS. 13 and 14) in connection with the intermittent movement of the belt 102. Also, at the position of the component stopper 104 facing the foremost chip component P, a permanent magnet MT such as a rare earth permanent magnet is provided so that the N pole face or the S pole face thereof faces the front end face of the foremost chip component P. Thereupon, the foremost chip component P coming into contact with the permanent magnet MT of the component stopper 104 at the component stop position is attracted to the component stopper 104 by the magnetic force of the permanent magnet MT. Also, the foremost chip component P is displaced forward together with the component stopper 104 while being attracted to the component stopper 104 when the component stopper 104 is displaced from the component stop position to the component takeout position. Although the permanent magnet MT having a width larger than the width of the chip component P is used in the figures, the width of the permanent magnet MT may be not larger than the width of the chip component P.

Figure 17:
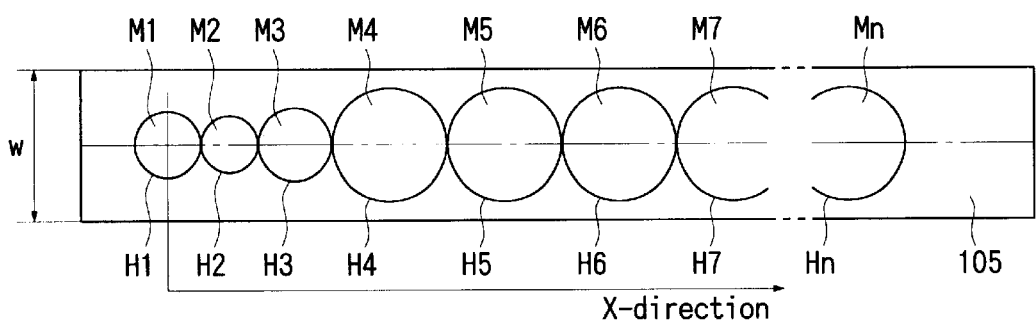
FIG. 17 is a top view of a magnet plate in the apparatus shown in FIG. 13.
Figure 18:
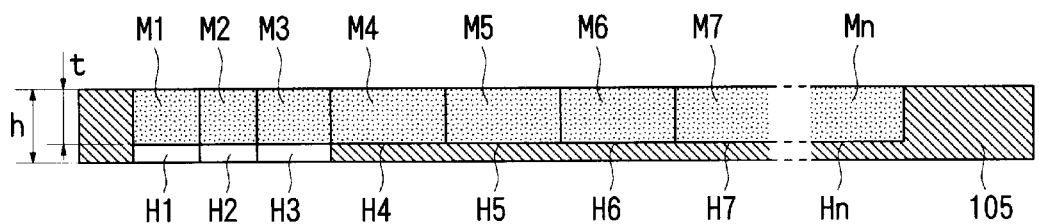
FIG. 18 is a longitudinal sectional view of the magnet plate in the apparatus shown in FIG. 13.

The magnet support plate 105 has, as shown in FIGS. 17 and 18, a width (w) and a thickness (h) substantially equal to the width and depth of the concave 103b of the belt guide 103. At the center on the upper surface of this magnet support plate 105, circular holes H1 to Hn for mounting magnets are formed from the front end toward the rear. The foremost circular hole H1 and the second and third circular holes H2 and H3 vertically penetrate the magnet support plate 105. In these circular holes H1 to Hn, disk-shaped permanent magnets M1 to Mn such as a rare earth permanent magnet are incorporated, respectively, so that the upper surfaces of the permanent magnets are flush with the upper surface of the plate 105, and the permanent magnets M1 to Mn are arranged linearly without a gap in the plate length direction. Also, as shown in FIG. 13, the center of the foremost permanent magnet M1 incorporated in the magnet support plate 105 substantially agrees with the center of the foremost chip component P in the length direction displaced forward together with the component stopper 104. The magnet support plate 105 is attached into the concave 103b of the belt guide 103 by screwing, fitting, or other techniques.

Thereupon, the chip components P conveyed by the belt 102 maintain a state of close contact with the surface of the belt 102 by being attracted by the magnetic force of the permanent magnets M1 to Mn. Also, the foremost chip component P displaced forward together with the component stopper 104 maintains a state of close contact with the surface of the belt 102 by being attracted by the magnetic force of the foremost permanent magnet M1. The size, arrangement position, surface magnetic field, and the like of respective permanent magnets M1 to Mn will be described later.

Figure 15:
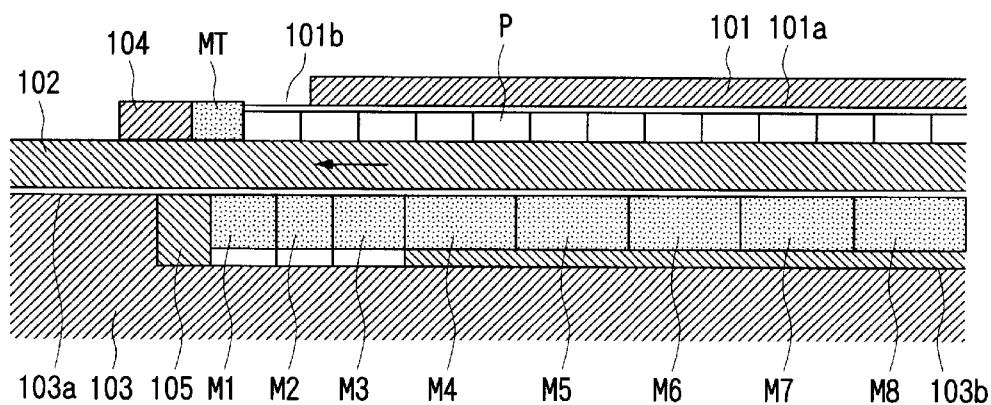
FIG. 15 is a view for illustrating a motion of the apparatus shown in FIG. 13, corresponding to FIG. 13.
Figure 16:
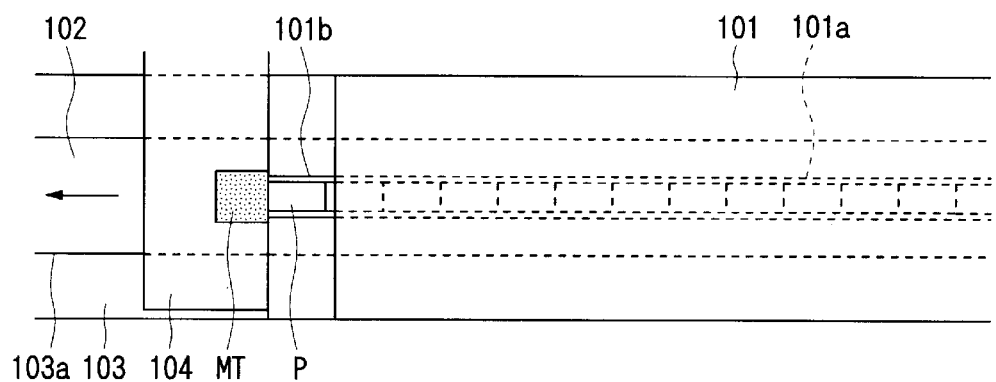
FIG. 16 is a top view of FIG. 15.

When the belt 102 advances through a predetermined distance, the chip components P on the belt 102 move forward in one line while being subjected to an aligning action by the guide groove 101a. At this time, as shown in FIGS. 15 and 16, since the component stopper 104 is in contact with the front end of the component guide 101, the chip components P conveyed forward in one line stop at the point where the foremost chip component P comes into contact with the permanent magnet MT of the component stopper 104. As described before, since the plural magnets M1 to Mn are arranged under the belt 102, the conveyed components P maintain a state of close contact with the belt 102 by being attracted by the magnetic force of the permanent magnets M1 to Mn. Therefore, even if the conveyed component P comes into contact with the inner surface of the guide groove 101a, the posture of the conveyed component P is not disordered by the resistance caused by the contact.

When the advance of the belt 102 stops, as shown in FIGS. 13 and 14, the component stopper 104 is displaced from the component stop position to the component takeout position. Since the foremost chip component P is attracted to the permanent magnet MT of the component stopper 104, the foremost chip component P is displaced forward together with the component stopper 104 while being attracted when the component stopper 104 is displaced to the component takeout position. Thereby, the foremost chip component P is separated from the succeeding chip component P, so that a gap is formed forcedly between the foremost chip component P and the succeeding chip component P. The foremost chip component P displaced forward together with the component stopper 104 maintains a state of close contact with the belt 102 by being attracted by the magnetic force of the foremost permanent magnet M1 while slipping on the surface of the belt 102.

As shown in FIGS. 13 and 14, the foremost chip component P is taken out by using the suction nozzle AN in a state in which the foremost chip component P is separated from the succeeding chip component P. After the foremost chip component P is taken out by using the suction nozzle AN, the same procedure as described above is repeated.

Here, the size, arrangement position, surface magnetic field, and the like of the respective permanent magnets M1 to Mn will be described in detail with reference to FIGS. 19 to 25.

When the chip component P conveyed by the belt 102 is taken out by using the suction nozzle AN, it is required to correct a faulty posture of the foremost chip component P fed to the component takeout position and to always keep the foremost chip component P in a stable posture. To meet this requirement, the size, arrangement position, and surface magnetic field of the respective permanent magnets M1 to Mn, especially the magnets M1 to M3 in the vicinity of the component takeout port should be regulated appropriately so that a flat magnetic field strength appears in a predetermined region including the component takeout position on the belt 102.

In the experiment examples shown in FIGS. 19 to 25, the thickness t (see FIG. 18) of the respective permanent magnets M1 to Mn is taken as 1.5 mm, and the distance s (see FIG. 13) from the top surface of the respective permanent magnets M1 to Mn to the top surface of the belt 2 is taken as 1.3 mm. Also, the chip components P having a length of about 2 mm are used. Further, the X axis of FIGS. 19(B) to 25(B) showing the magnetic field strength represents a distance from the center of the foremost permanent magnet M1 to the rear (see FIG. 17).

The permanent magnet MT is provided on the component stopper 104, and the working range of the permanent magnet MT is set to the front from the center of the foremost permanent magnet M1, and the polarity (S pole) of the face of the permanent magnet MT facing the foremost chip component P is different from the top-face polarity (N pole) of the foremost permanent magnet M1. Therefore, the magnetic field strength at the rear from the center of the foremost permanent magnet M1 is not disturbed greatly by the magnetic force of the permanent magnet MT.

In the experimental conditions shown in FIG. 19(A), the top-face polarities of all of the permanent magnets M1 to M3 are set to be N pole, and those of M4 and the rear permanent magnets are set so that S pole and N pole are arranged alternately. Also, as the permanent magnets M1 to M3, permanent magnets having a surface magnet field of 2200 G are used, and as the permanent magnets M4 and the rear ones, permanent magnets having the same surface magnetic field are used. Further, as the permanent magnets M1 to M3, permanent magnets having a diameter of 1.8 mm, 1.6 mm, and 2.0 mm are used, respectively, and as the permanent magnet M4 and the rear ones, permanent magnets having a diameter of 3.0 mm are used. In the case of these experimental conditions, as shown in FIG. 19(B), on the top surface of the belt 102, a flat magnetic field strength with a strength average value of about 400 G can be formed in the range of about 3.0 mm from the center of the foremost permanent magnet M1 toward the rear.

In the experimental conditions shown in FIG. 20(A), the top-face polarities of all of the permanent magnets M1 to M3 are set to be N pole, and those of M4 and the rear permanent magnets are set so that S pole and N pole are arranged alternately. Also, as the permanent magnets M1 to M3, permanent magnets having a surface magnet field of 3000 G are used, and as the permanent magnet M4 and the rear ones, permanent magnets having a surface magnetic field of 2200 G are used. Further, as the permanent magnets M1 to M3, permanent magnets having a diameter of 1.8 mm, 1.6 mm, and 2.0 mm are used, respectively, and as the permanent magnet M4 and the rear ones, permanent magnets having a diameter of 3.0 mm are used. In the case of these experimental conditions, as shown in FIG. 20(B), on the top surface of the belt 102, a flat magnetic field strength with a strength average value of about 550 G can be formed in the range of about 3.0 mm from the center of the foremost permanent magnet M1 toward the rear.

In the experimental conditions shown in FIG. 21(A), the top-face polarities of all of the permanent magnets M1 to M3 are set to be N pole, and those of M4 and the rear permanent magnets are set so that S pole and N pole are arranged alternately. Also, as the permanent magnets M1 to M3, permanent magnets having a surface magnet field of 2200 G are used, and as the permanent magnet M4 and the rear ones, permanent magnets having the same surface magnetic field are used. Further, as the permanent magnets M1 to M3, permanent magnets having a diameter of 2.0 mm are used, and as the permanent magnet M4 and the rear ones, permanent magnets having a diameter of 3.0 mm are used. In the case of these experimental conditions, as shown in FIG. 21(B), on the top surface of the belt 102, a flat magnetic field strength with a strength average value of about 430 G can be formed in the range of about 4.0 mm from the center of the foremost permanent magnet M1 toward the rear.

In the experimental conditions shown in FIG. 22(A), the top-face polarities of all of the permanent magnets M1 to M3 are set to be N pole, and those of M4 and the rear permanent magnets are set so that S pole and N pole are arranged alternately. Also, as the permanent magnets M1 to M3, permanent magnets having a surface magnet field of 2200 G are used, and as the permanent magnet M4 and the rear ones, permanent magnets having the same surface magnetic field are used. Further, as the permanent magnets M1 to M3, permanent magnets having a diameter of 3.0 mm are used, and as the permanent magnet M4 and the rear ones, permanent magnets having the same diameter are used. In the case of these experimental conditions, as shown in FIG. 22(B), on the top surface of the belt 102, a magnetic field strength with a strength average value of about 620 G can be formed in the range of about 6.0 mm from the center of the foremost permanent magnet M1 toward the rear. The magnetic field of this case has a greater undulation than that of the other cases, but this does not become a hindrance in practical use.

In the experimental conditions shown in FIG. 23(A), the top-face polarities of the permanent magnets M1 and M2 are set to be N pole, and those of M3 and the rear permanent magnets are set so that S pole and N pole are arranged alternately. Also, as the permanent magnets M1 and M2, permanent magnets having a surface magnet field of 2200 G are used, and as the permanent magnet M3 and the rear ones, permanent magnets having the same surface magnetic field are used. Further, as the permanent magnets M1 and M2, permanent magnets having a diameter of 1.8 mm and 2.0 mm are used, respectively, and as the permanent magnet M3 and the rear ones, permanent magnets having a diameter of 3.0 mm are used. In the case of these experimental conditions, as shown in FIG. 23(B), on the top surface of the belt 102, a flat magnetic field strength with a strength average value of about 400 G can be formed in the range of about 2.0 mm from the center of the foremost permanent magnet M1 toward the rear.

In the experimental conditions shown in FIG. 24(A), the top-face polarities of the permanent magnets M1 and M2 are set to be N pole, the magnet corresponding to M3 is eliminated, and the top-face polarities of M4 and the rear permanent magnets are set so that N pole and S pole are arranged alternately. Also, as the permanent magnets M1 and M2, permanent magnets having a surface magnet field of 2200 G are used, and as the permanent magnet M4 and the rear ones, permanent magnets having the same surface magnetic field are used. Further, as the permanent magnets M1 and M2, permanent magnets having a diameter of 1.8 mm are used, and as the permanent magnet M4 and the rear ones, permanent magnets having a diameter of 3.0 mm are used. In the case of these experimental conditions, as shown in FIG. 24(B), on the top surface of the belt 102, a flat magnetic field strength with a strength average value of about 400 G can be formed in the range of about 2.0 mm from the center of the foremost permanent magnet M1 toward the rear.

In the experimental conditions shown in FIG. 25(A), the top-face polarities of all of the permanent magnets M1 to M3 are set to be N pole, the magnet corresponding to M4 is eliminated, and the top-face polarities of M5 and the rear permanent magnets are set so that S pole and N pole are arranged alternately. Also, as the permanent magnets M1 to M3, permanent magnets having a surface magnet field of 2200 G are used, and as the permanent magnet M5 and the rear ones, permanent magnets having the same surface magnetic field are used. Further, as the permanent magnets M1 to M3, permanent magnets having a diameter of 1.8 mm, 1.6 mm, and 1.8 mm are used, respectively, and as the permanent magnet M5 and the rear ones, permanent magnets having a diameter of 3.0 mm are used. In the case of these experimental conditions, as shown in FIG. 25(B), on the top surface of the belt 102, a flat magnetic field strength with a strength average value of about 410 G can be formed in the range of about 3.5 mm from the center of the foremost permanent magnet M1 toward the rear.

As is seen from the above experiment results, when the distance of flat magnetic field is 3 mm, the diameters of the three permanent magnets M1 to M3 from the forefront should be 1.8 mm, 1.6 mm, and 2.0 mm, respectively, as shown in FIGS. 19(A) and 20(A). Also, when the distance of flat magnetic field is 2 mm, the diameters of the two permanent magnets M1 and M2 from the forefront should be 1.8 mm and 2.0 mm, respectively, as shown in FIGS. 23(A) and 24(A).

Thus, if a flat magnetic field strength is formed in the predetermined region including the component takeout position on the belt 102 by the permanent magnets M1 to Mn arranged under the belt 102, especially by the permanent magnets M1 to M3, the chip component P, fed to the component takeout position by the belt 102, can surely be prevented from taking a faulty posture, and also the chip component P fed to the component takeout position can be kept in a stable posture. Thereby, the chip component P can be taken out by the suction nozzle AN very satisfactorily. Also, when the foremost chip component P in contact with the component stopper 104 is displaced forward together with the component stopper 104, the posture of the chip component P during the displacement can be kept properly.

When the permanent magnets having a small size not larger than 2.0 mm are used, it is difficult to incorporate the polarized magnets in the plate 105 with the polarities thereof arranged properly because the repulsive force between the magnets is high. In such a case, after the unpolarized magnet (ferromagnetic member) is incorporated in the plate 105 by using an adhesive jointly, the magnet should be polarized.

Also, disk-shaped permanent magnets M1 to Mn need not necessarily be used, and instead rectangular prism shaped permanent magnets (M1', M2', M3') as shown in FIG. 26 may be used. If the permanent magnets of such a shape are used, a higher magnetic field strength can be obtained as compared with the case where the disk-shaped magnets are used.

Further, the permanent magnet MT provided on the component stopper 104 is not necessarily needed. Also, the apparatus using the fixed type component stopper portion without the use of a magnet, shown in FIGS. 1 to 9, can also achieve the same operation and effects as described above.

Next, the construction effective in separating the foremost component from the succeeding component will be described with reference to FIGS. 27 to 38.

In FIGS. 27 to 38, reference numeral 201 denotes a frame, 202 denotes a hopper, 203 denotes a fixed pipe, 204 denotes a movable pipe, 205 denotes a first component guide, 206 denotes a second component guide, 207 denotes a third component guide, 208 denotes a belt guide, 209 denotes a belt, 210 denotes a pair of front and rear pulleys, 211 denotes a stopper plate, 212 denotes a fixing plate, 213 denotes a stopper pin, 214 denotes a magnet plate, 215 denotes a control lever, 216 denotes a pipe driving lever, 217 denotes a relay link, 218 denotes a ratchet driving lever, 219 denotes a ratchet, 220 denotes a ratchet wheel, 221 denotes a bracket, SS1 to SS4 denote coil springs, and P denotes a chip component. In the following explanation, the right and left in FIG. 27 will be described as the rear and front for convenience, respectively.

The frame 201 serves to support composing elements described later. On the bottom surface of this frame 201, two positioning pins 201a which can be inserted into holes (not shown) of a mating member such as a table are provided as shown in FIG. 27.

Figure 27:
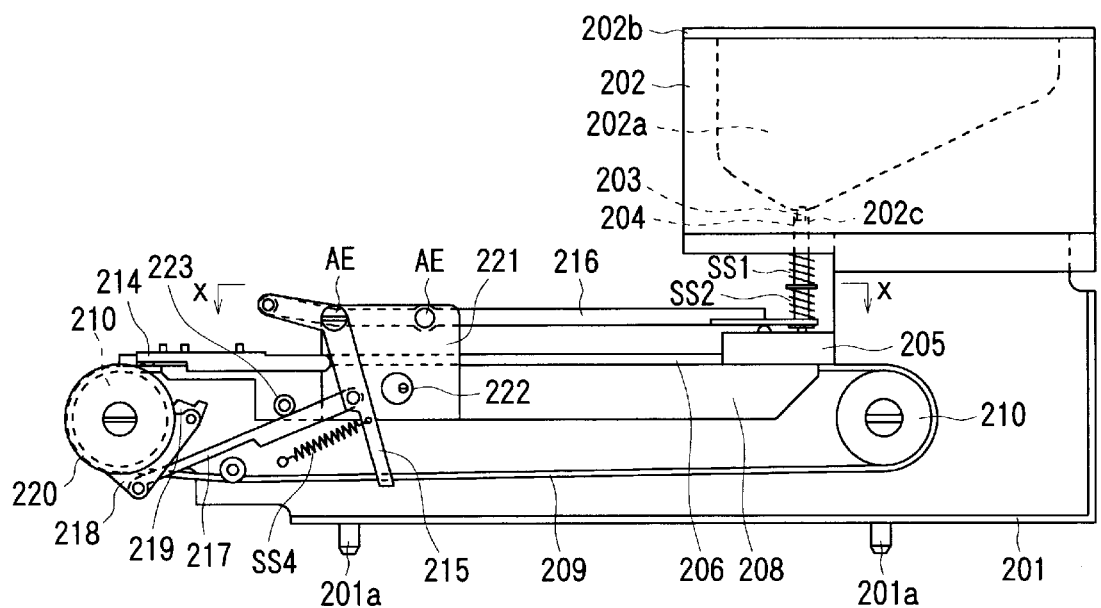
FIG. 27 is a side view of an apparatus showing a construction effective in separating a foremost component from a succeeding component.
Figure 28:
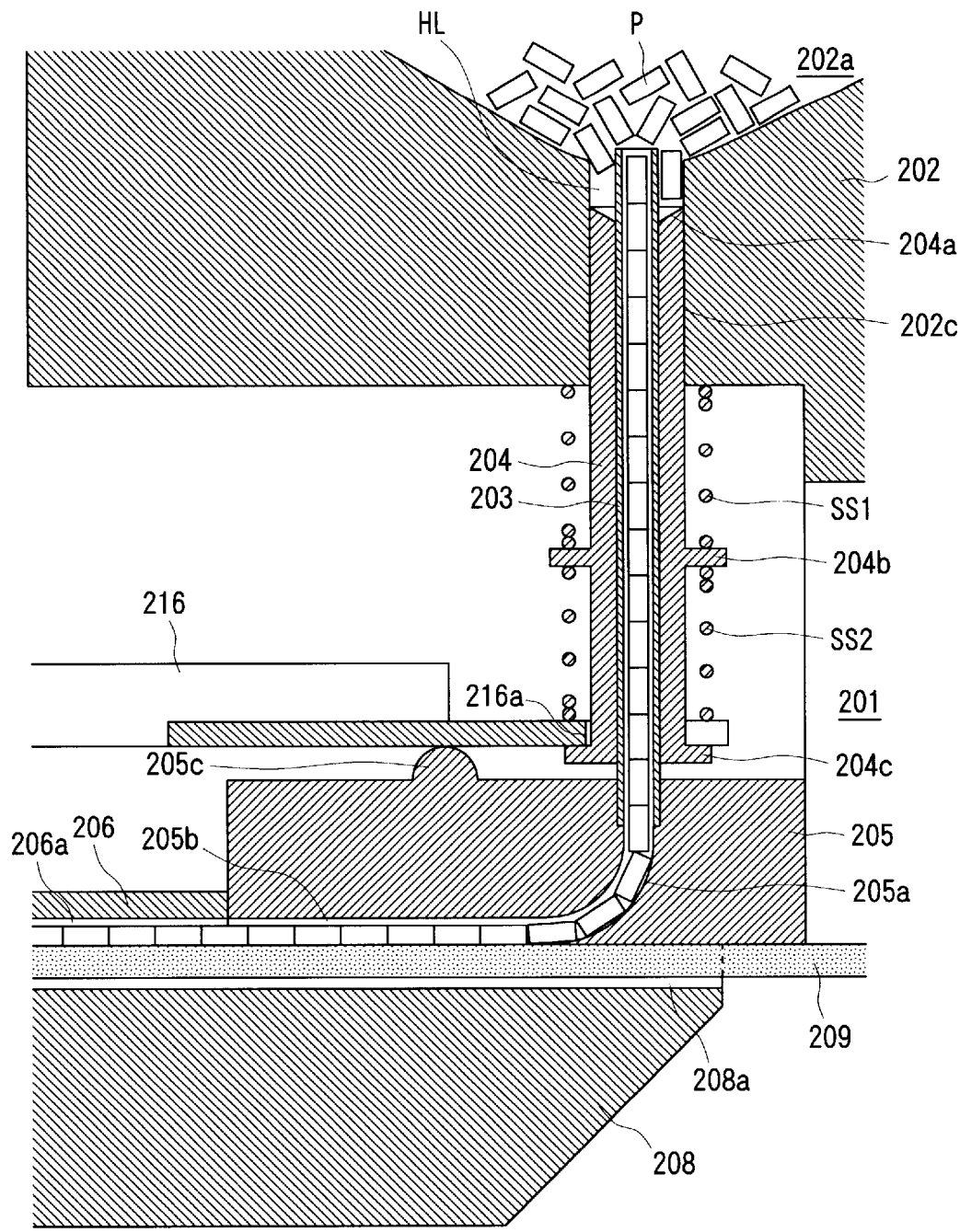
FIG. 28 is an enlarged longitudinal sectional view of a principal portion of the apparatus shown in FIG. 27.

The hopper 202 has, as shown in FIGS. 27 and 28, a storage chamber 202a, a cover 202b for covering the top opening of the storage chamber 202a so as to be opened and closed freely, and an insertion hole 202c for the movable pipe, which is formed so as to penetrate the bottom of the storage chamber 202a. The hopper 202 is removably attached to the frame 201. The insertion hole 202c basically has a circular transverse cross-sectional shape, but it may have a rectangular or other transverse cross-sectional shape. In the storage chamber 202a, one kind of many chip components P having a quadrangular prism or cylindrical shape as shown in FIGS. 2(A) to 2(C) such as a chip capacitor, a chip resistor, and a chip inductor are stored in a bulk state. Needless to say, an electronic component other than the chip component, for example, a composite component such as a LC filter and a network, and an integrated circuit component such as a semiconductor device can be handled if they have the same shape as described above. Since any electronic component such as the chip component has an external electrode, internal conductor, or the like, it can be attracted to a permanent magnet PM described later.

The fixed pipe 203 is made of a metallic pipe material or a rigid resin pipe material with a given length. As shown in FIG. 28, the fixed pipe 203 is fixed to the first component guide 205 at the lower end thereof, and inserted vertically in the central position of the insertion hole 202c so that the upper end thereof agrees substantially with the upper end of the insertion hole 202c. The wall thickness of the fixed pipe 203 is smaller than the maximum length of the end face of the chip component P being fed. The upper end inner edge of the fixed pipe 203 is rounded or chamfered as necessary to prevent the chip component P from being caught. The inner hole of the fixed pipe 203 has a rectangular or circular transverse cross-sectional shape slightly larger than the end face shape of the chip component P. Accordingly, the chip components P in the storage chamber 202a are taken in the upper end opening of the fixed pipe 203 one by one in the lengthwise direction, and moved downward in the fixed pipe 203 by gravity in the same direction.

The movable pipe 204 is made of a metallic pipe material or rigid resin pipe material with a given length having an external shape slightly smaller than the insertion hole 202c and an internal shape slightly larger than the fixed pipe 203. As shown in FIG. 28, the movable pipe 204 is disposed in an annular gap formed between the insertion hole 202c and the fixed pipe 203 so as to be capable of moving vertically in such a manner that the upper end thereof is slightly lower than the upper end of the insertion hole 202c in the descending state. The wall thickness of the movable pipe 204 is larger than the maximum length of the end face of the chip component P being fed. Also, at the upper end of the movable pipe 204, a cone-shaped guide face 204a tilting downward toward the pipe center is provided. Further, two collars 204b and 204c are formed on the external face of the movable pipe 204, and the coil springs SS1 and SS2 having a force relationship of SS1<SS2 are mounted above and below the upper collar 204b.

The first component guide 205 has, as shown in FIG. 28, a curved passage 205a, having a transverse cross-sectional shape agreeing substantially with the inner hole of the fixed pipe 203, therein. Also, the first component guide 205 has a straight guide groove 205b, which guides chip components P conveyed by the belt 209, on the lower surface thereof. The curved passage 205a is curved from the vertical direction to the horizontal direction in the range of about 90 degrees with a fixed curvature viewed from the side. The guide groove 205b basically has a rectangular transverse cross-sectional shape slightly larger than the end face shape of the chip component P, but it may have another cross-sectional shape if it can guide the chip components P arranged in one line. Also, the guide groove 205b is continuous with the curved passage 205a without step. This first component guide 205 is removably attached to the frame 201 or the belt guide 208 so that the upper end of the curved passage 205a is continuous with the inner hole of the fixed pipe 203. Also, on the upper surface of the first component guide 205, a positioning protrusion 205c is formed which is in contact with the later-described pipe driving lever 216.

The second component guide 206 has, as shown in FIGS. 27 to 30, a straight guide groove 206a having a transverse cross-sectional shape substantially equal to that of the aforesaid guide groove 205b, on the lower surface thereof. This second component guide 206 is removably attached to the frame 201 or the belt guide 208 so that the rear end of the guide groove 206a is continuous with the front end of the aforesaid curved passage 205a.

The third component guide 207 has, as shown in FIG. 29 to FIG. 31(A) and FIG. 31(B), a straight guide groove 207a, having a transverse cross-sectional shape substantially equal to that of the aforesaid guide groove 206a, on the lower surface thereof. This third component guide 207 is removably attached to the frame 201 or the belt guide 208 so that the rear end of the guide groove 207a is continuous with the front end of the aforesaid guide groove 206a. Also, at the front end of the guide groove 207a, there is provided a component takeout port 207b for taking out the foremost chip component P from the guide groove 207a to the outside. Further, at one side on the front of the third component guide 207, there is formed a rectangular concave 207c in which a part of the later-described stopper plate 211 is fitted.

The belt guide 208 has, as shown in FIG. 28, a straight guide groove 208a having a width and depth slightly larger than the width and thickness of the belt 209, respectively, on the upper surface thereof. This belt guide 208 is disposed under the first to third component guides 205 to 207 so that the center of the guide groove 208a in the width direction agrees with the centers of the aforesaid guide grooves 205b, 206a and 207a in the width direction, and removably attached to the frame 201. Also, at the side of the belt guide 208, the bracket 221 is attached to support the control lever 215 and the pipe driving lever 216.

The belt 209 consists of a non-magnetic endless timing belt or an endless flat belt formed of synthetic rubber, soft resin, or the like material. As shown in FIG. 27, this belt 209 is wound around the paired pulleys 210, which are rotatably supported by the frame 201 at the front and rear positions of the belt guide 208, with a predetermined tension. Also, the upper portion of the belt 209 between the pulleys 210 is positioned in the guide groove 208a of the belt guide 208, and comes into contact movably with the lower surfaces of the first to third component guides 205 to 207 with the winding tension.

The stopper plate 211 has, as shown in FIG. 29 to FIG. 31(A) and FIG. 31(B), a flat face 211a for component stop, which closes the front end of the guide groove 207a of the third component guide 207, an insertion hole 211b for a stopper pin, which is formed from the component stop face 211a toward the front, and a guide concave 211c for magnet, which is formed at the front end position of the insertion hole 211b. Also, at one side on the rear of the stopper plate 11, there is formed a thin portion 211d which is fitted in the concave 207c of the third component guide 207. Further, on the upper surface of the thin portion 211d, there is formed a straight groove 211e in which a bent portion 212a of the later-described fixing plate 212 is inserted. Although omitted in the figures, at the bottom of the straight groove 211e, there are formed semicircular concaves with which protrusions 212b of the later-described fixing plate 212 can engage. Further, at one side on the upper surface of the stopper plate 211, mounting holes 211f for erecting guide pins GP are formed so as to correspond to elongated holes 214b of the later-described magnet plate 214. The stopper plate 211 is removably attached to the third component guide 207 with screws SC in a state in which the thin portion 211d is fitted in the concave 207c of the third component guide 207. In this attaching state, the opening of the insertion hole 211b on the side of the component stop face 211a agrees with the center of the guide groove 207a.

Figure 29:
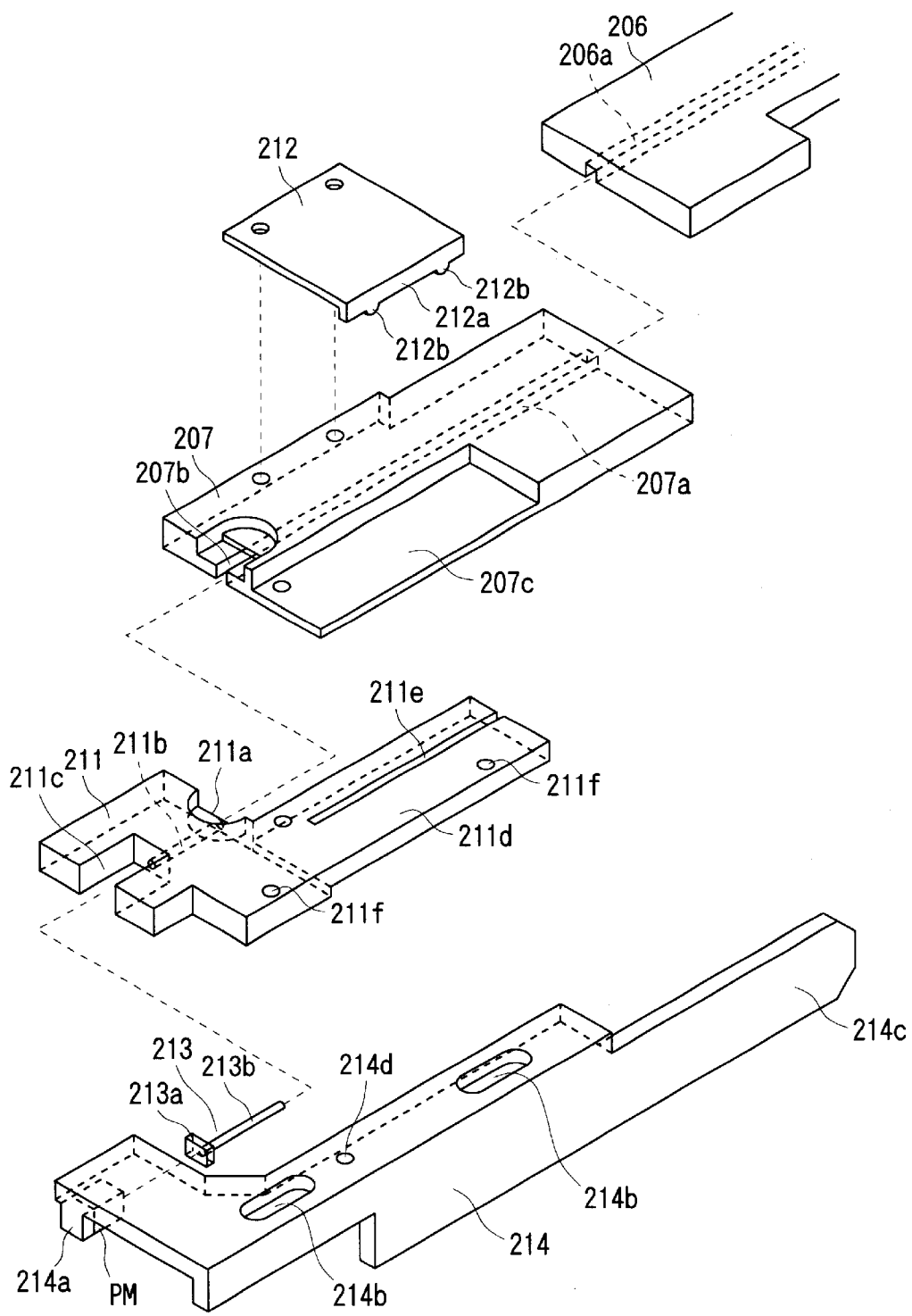
FIG. 29 is a perspective view of second and third component guides, a stopper plate, a stopper pin, a magnet plate, and a fixing plate in the apparatus shown in FIG. 27.
Figure 30:
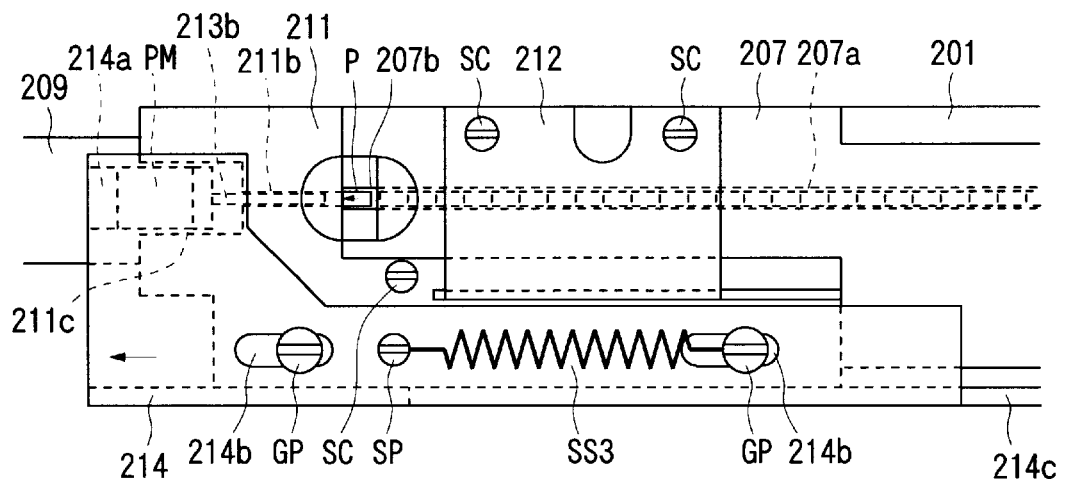
FIG. 30 is an enlarged top view of a principal portion of the apparatus shown in FIG. 27.

The fixing plate 212 is, as shown in FIGS. 29 and 30, formed of a metal plate having a springing property, and has a bent portion 212a at one side edge. Also, semicircular protrusions 212b is formed on the bent portion 212a. This fixing plate 212 is removably attached to the third component guide 207 with screws SC on the side opposite to the bent portion 212a in a state in which the bent portion 212a is fitted in the straight groove 211e of the stopper plate 211. The fixing plate 212 performs positioning and holding when the stopper plate 211 is attached to the third component guide 207.

The stopper pin 213 has, as shown in FIG. 29 to FIG. 31(A) and FIG. 31(B), a base portion 213a having a quadrangular prism shape and a rod portion 213b having a circular transverse cross section. The rod portion 213b is longer than the insertion hole 211b of the stopper plate 211, and the transverse cross-sectional shape thereof is slightly smaller than the insertion hole 211b. This stopper pin 213 is made of a magnetic material including iron and nickel or the like, preferably a ferromagnetic material, so as to be capable of being magnetized by the later-described permanent magnet PM. The stopper pin 213 is disposed so as to be movable longitudinally along the insertion hole 211b in such a manner that the rod portion 213b is inserted into the insertion hole 211b of the stopper plate 211 and the base portion 213a is inserted into the guide concave 211c.

The magnet plate 214 has, as shown in FIG. 27 and FIG. 29 to FIG. 31(A) and FIG. 31(B), a magnet support portion 214a, two elongated holes 214b for guiding the front and rear movement, and a driven portion 214c which is driven by being pressed by the later-described control lever 215. A mounting hole 214d for mounting a coil spring support pin SP is formed between the two elongated holes 214b. Further, on the inside of the support portion 214a, a quadrangular prism shaped permanent magnet PM such as a rare earth permanent magnet is fixed so that either the N pole face or S pole face faces the support portion 214a. This magnet plate 214 is disposed so as to be movable longitudinally by attaching the guide pins GP in the mounting holes 214d through the elongated holes 214b in a state in which the support portion 214a and the permanent magnet PM are inserted into the guide concave 211c of the stopper plate 211. Also, a coil spring SS3 is installed between the support pin SP mounted in the mounting hole 214d and the rear-side guide pin GP. The magnet plate 214 is urged rearward by the coil spring SS3. The coil spring SS3 and the later-described coil spring SS4 have a force relationship of SS3<SS4. In this attaching state, the base portion 213a of the stopper pin 213 is attracted to the permanent magnet PM, and the stopper pin 213 is magnetized by the permanent magnet PM, by which either N pole or S pole appears at the tip end of the rod portion 213b.

Figure 32:
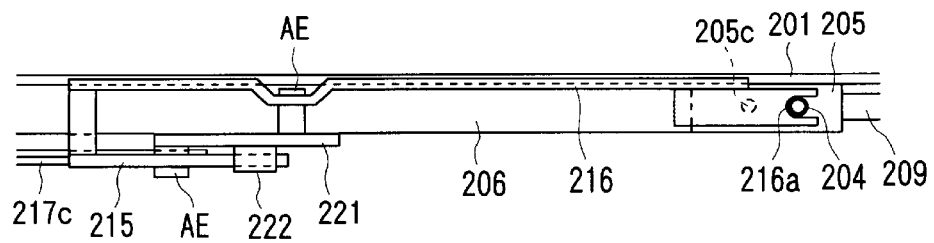
FIG. 32 is an enlarged sectional view taken along a line X—X of the apparatus shown in FIG. 27.

The control lever 215 has, as shown in FIGS. 27 and 32, a bent portion attached rotatably to the bracket 221 via a shaft AE, and is urged clockwise in FIG. 27 by a coil spring SS4 installed between the control lever 215 and the frame 201. The rotation limit position of this control lever 215 is regulated by a positioning stopper 222 provided on the bracket 221. This positioning stopper 222 is made up of a disk and a screw for fixing the disk at an eccentric position. By changing the fixing direction of the disk, the rotation limit position of the control lever 215, that is, the vertical stroke of the movable pipe 204 and the amount of one movement of the belt 209 can be adjusted finely. The return position of the control lever 215 is regulated by the contact of the relay link 217 with a positioning stopper 223 provided on the belt guide 208.

The pipe driving lever 216 has, as shown in FIGS. 27, 28 and 32, a front portion from the center attached rotatably to the bracket 221 via the shaft AE. The front end of the pipe driving lever 216 is rotatably connected to the upper end of the control lever 215. Also, at the rear end of the pipe driving lever 216 is provided an engagement portion 216a consisting of a U-shaped portion or a round hole portion. This engagement portion 216a is mounted between the lower collar 204c of the movable pipe 204 and the lower coil spring SS2. The pipe driving lever 216 is turned around the shaft AE in the counterclockwise direction in FIG. 27 by turning the aforesaid control lever 215a in the same direction.

The relay link 217 is, as shown in FIGS. 27 and 32, rotatably connected to the lower portion of the rotation center of the control lever 215 at one end, and rotatably connected to the ratchet driving lever 218 at the other end.

The ratchet driving lever 218 is, as shown in FIG. 27, rotatably attached to a shaft 210a supporting the front pulley 210. Also, at the rear projecting portion of the ratchet driving lever 218, the ratchet 219 having a sharp portion is rotatably attached via a shaft. This ratchet 219 is urged in the counterclockwise direction in FIG. 27 by a coil spring (not shown) installed between the ratchet 219 and the ratchet driving lever 218, so that the sharp portion engages with one groove of the ratchet wheel 220.

The ratchet wheel 220 is, as shown in FIG. 27, fixed to the front pulley 210 so that the mutual rotation centers agree with each other, so that it turns along with the front pulley 210. On the outer peripheral surface of the ratchet wheel 220, a plurality of V-shaped grooves are provided with a predetermined angular pitch.

Figure 33:
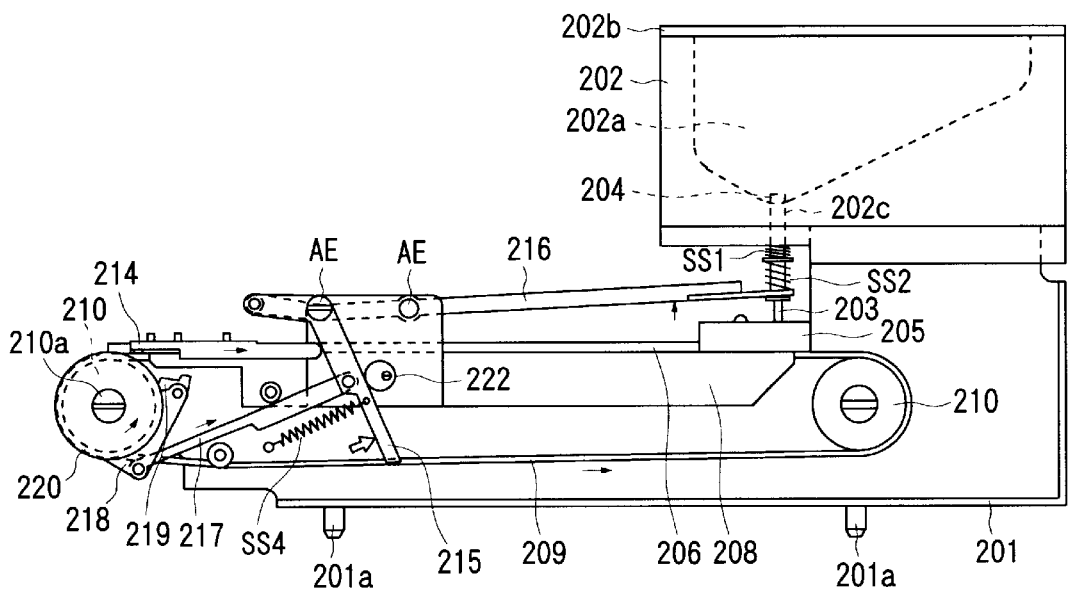
FIG. 33 is a view for illustrating a motion of the apparatus shown in FIG. 27, corresponding to FIG. 27.

The lower end of the control lever 215 is pressed rearward by a portion moving in connection with the suction nozzle AN or other driving device (not shown) as shown in FIG. 33 when the foremost chip component P is taken out through the component takeout port 207b in a predetermined cycle by the suction nozzle AN (see FIG. 31(A)).

When the movable pipe 204 is at the descending position, an annular concave portion HL is formed between the upper end of the movable pipe 204, the inner surface of the insertion hole 202c, and the outer surface of the fixed pipe 203 as shown in FIG. 28, so that a small number of chip components P enter this annular concave portion HL.

If the lower end of the control lever 215 is pressed rearward through the predetermined distance in this state in the same manner as described above, the control lever 215 is turned around the shaft AE counterclockwise through a predetermined angle against the urging force of the coil spring SS4 as shown in FIG. 33. Also, the pipe driving lever 216 is turned around the shaft AE counterclockwise through a predetermined angle by the turning of the control lever 215. By the turning of the pipe driving lever 216, as shown in FIG. 34, the movable pipe 204 rises from the descending position through a predetermined distance against the urging force of the coil spring SS1, so that the upper end thereof enters the storage chamber 202a.

Figure 34:
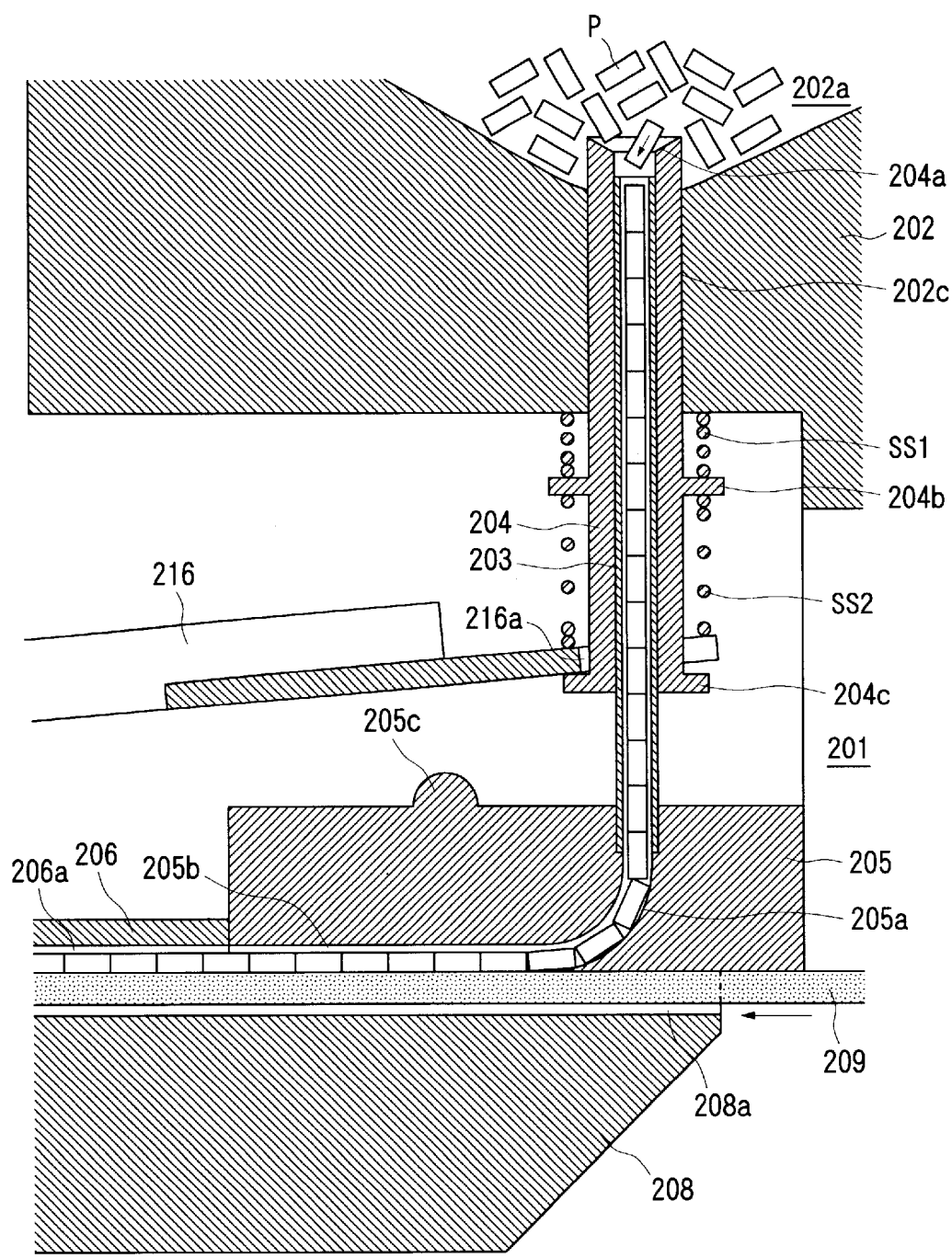
FIG. 34 is a view for illustrating a motion of the apparatus shown in FIG. 27, corresponding to FIG. 28.
Figure 35:
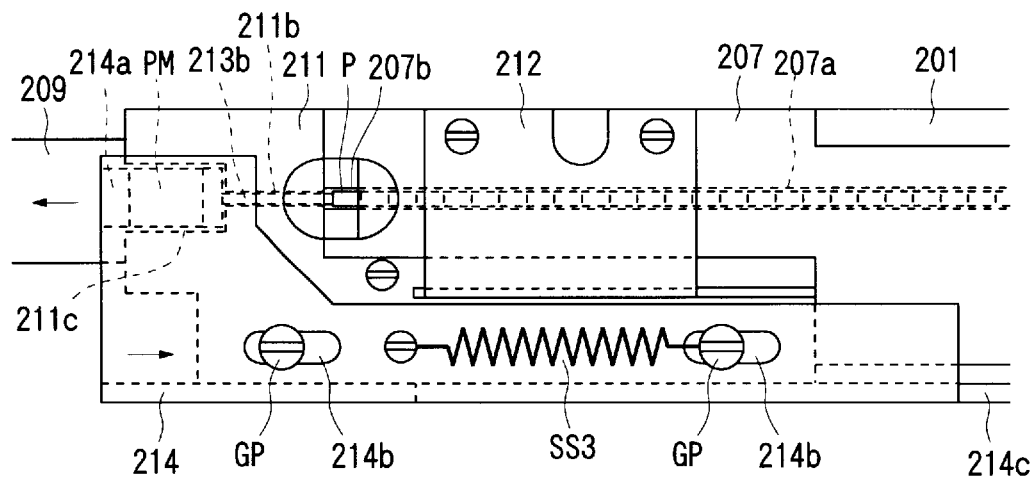
FIG. 35 is a view for illustrating a motion of the apparatus shown in FIG. 27, corresponding to FIG. 30.
Figure 36:
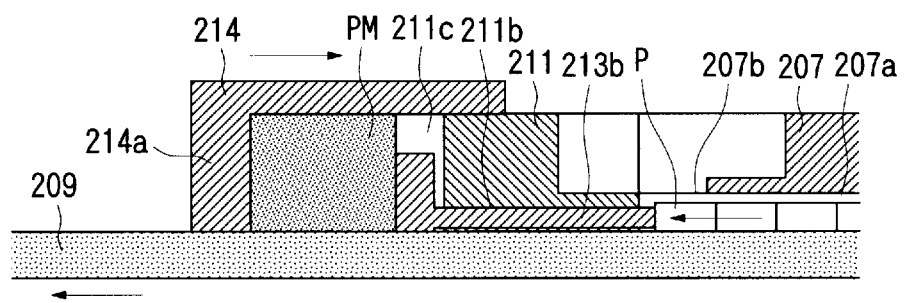
FIGS. 36(A) and 36(B) are views for illustrating a motion of the apparatus shown in FIG. 27, corresponding to FIGS. 31(A) and 31(B), respectively.
Figure 36:
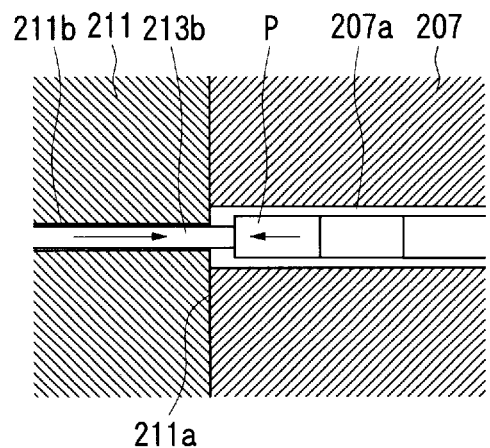
Figure 37:
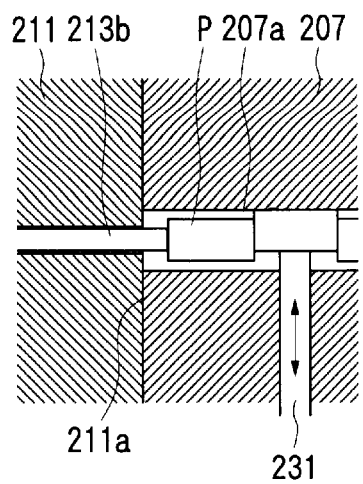
FIGS. 37(A) to 37(C) are views showing examples of a succeeding component retaining mechanism, respectively.
Figure 37:
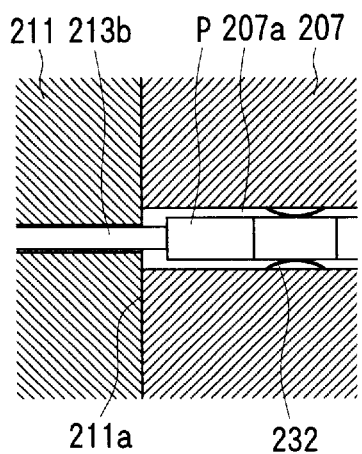
Figure 37:
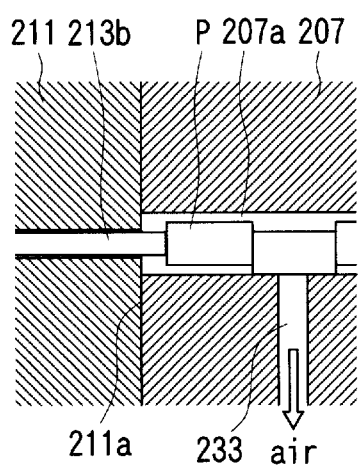
Figure 38:
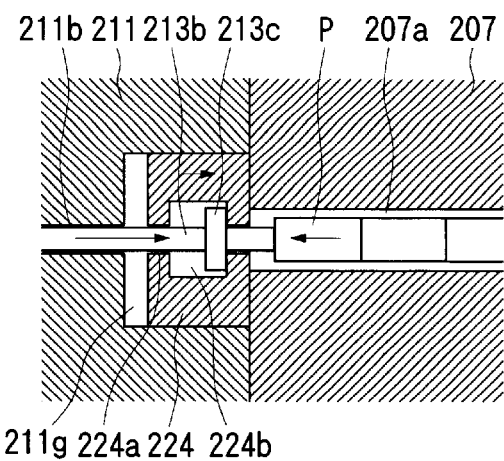
FIGS. 38 (A) to 38(D) are views showing a modified example of the apparatus shown in FIG. 27 and for illustrating a motion thereof.
Figure 38:
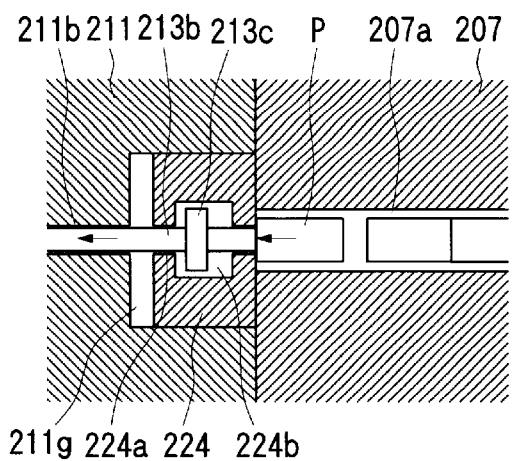
Figure 38:
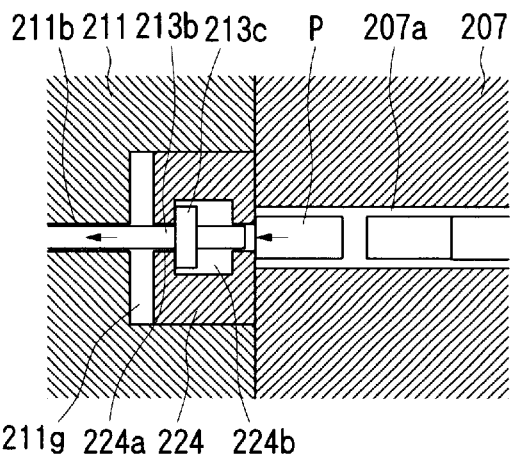
Figure 38:
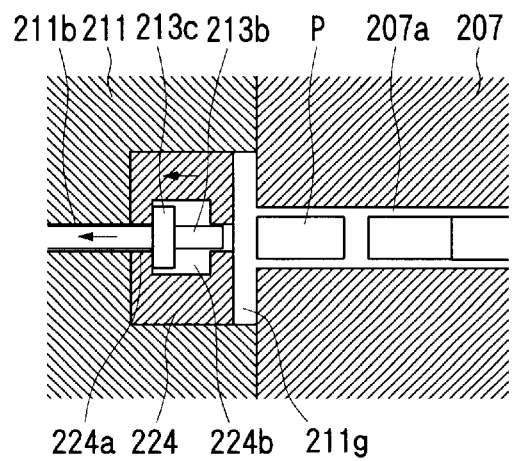

In the process in which the movable pipe 204 moves from the descending position to the ascending position, as shown in FIG. 34, the chip components P in the annular concave portion HL are raised upward, and at the same time, the chip components P in the storage chamber 202a are subjected to a disentangling action. If there are chip components P lying on the fixed pipe 203, these chip components P are pushed away by the rising movable pipe 204. In this process, the chip components P in the storage chamber 202a are taken in the upper end opening of the fixed pipe 203 one by one in the lengthwise direction through the guide face 204a of the movable pipe 204 or directly. The chip component P taken into the fixed pipe 203 moves downward in the fixed pipe 203 in the lengthwise direction by gravity.

When the pressure on the lower end of the control lever 215 is released after the control lever 215 is turned through the predetermined angle, the control lever 215 is returned to the original position by the urging force of the coil spring SS4 (see FIG. 27). With the return of the control lever 215, the pipe driving lever 216 is also returned to the original position (see FIG. 27). By the return of the pipe driving lever 216, the movable pipe 204 is returned to the original position while using the urging force of the coil spring SS1 (see FIG. 28).

In the process in which the movable pipe 204 moves from the ascending position to the descending position, as shown in FIG. 28, a small number of chip components P enter the annular concave portion HL again, and all of the stored components lower. In this process as well, like the aforesaid rising process, the chip components P in the storage chamber 202a are taken in the upper end opening of the fixed pipe 203 one by one in the lengthwise direction through the guide face 204a of the movable pipe 204 or directly. The chip component P taken into the fixed pipe 203 moves downward in the fixed pipe 203 in the lengthwise direction by gravity.

Thus, the chip components P are taken in the fixed pipe 203 in both of the rising process and the lowering process of the movable pipe 204. The chip components P taken in the upper end opening of the fixed pipe 203 one by one in the lengthwise direction move downward in the fixed pipe 203 in the lengthwise direction by gravity, and enter the curved passage 205a under the fixed pipe 203. The chip component P entering the curved passage 205a changes its posture by about 90 degrees from vertical to horizontal in the process in which it moves in the curved passage 205a along its curvature by gravity. Then, the posture-changed chip component P is discharged onto the belt 209 (see FIGS. 28 and 34).

On the other hand, when the lower end of the control lever 215 is pressed rearward through the predetermined distance, the relay link 217 is moved rearward through a predetermined distance as shown in FIG. 33. By the movement of the relay link 217, the ratchet driving lever 218 is turned around the shaft 210a counterclockwise through a predetermined angle.

In the process in which the ratchet driving lever 218 is turned counterclockwise from the standby position through the predetermined angle, as shown in FIG. 33, the ratchet wheel 220 with which the ratchet 219 engages is turned along with the ratchet driving lever 218 in the same direction through the same angle, so that the front pulley 210 is also turned in the same direction through the same angle. Thereby, the belt 209 is moved forward through a distance corresponding to the turning angle of the front pulley 210, preferably through a distance slightly larger than the length of the chip component P. By the movement of the belt 209, the chip components P discharged from the curved passage 205a onto the belt 209 are moved forward through the same distance along with the belt 209.

The forward movement of the belt 209 is repeated each time the foremost chip component P is taken out through the component takeout port 207b in the predetermined cycle. Therefore, the chip components P are discharged in succession from the curved passage 205a onto the belt 209 each time the belt 209 moves forward. The chip components P discharged in succession are moved forward in succession in a state of being arranged in one line while being subjected to an aligning action by the guide grooves 205b, 206a and 207a.

On the other hand, when the lower end of the control lever 215 is pressed rearward through a predetermined distance, as shown in FIG. 33, FIG. 35, and FIGS. 36(A) and 36(B), the magnet plate 214 is moved rearward through a predetermined distance by the urging force of the coil spring SS3 while contacting with the control lever 215. By the movement of the magnet plate 214, the stopper pin 213 attracted to the permanent magnet PM is also moved rearward through the same distance, and the rear end of the rod portion 213b of the stopper pin 213 projects rearward through a predetermined distance from the rear end opening of the insertion hole 211b. That is to say, the chip components P conveyed forward in one line are stopped when the foremost chip component P comes into contact with the rear end of the rod portion 213b of the stopper pin 213, and the succeeding chip components P are ranged in one line behind the foremost chip component P without a gap. When the amount of movement before the foremost chip component P comes into contact with the rear end of the rod portion 213b is smaller than the amount of one movement of the belt, only the belt 209 moves while slipping under the chip components P by the difference between the amounts of movement even after the foremost chip component P comes into contact with the rear end of the rod portion 213b.

Also, when the pressure on the lower end of the control lever 215 is released, as shown in FIG. 27, FIG. 30, and FIGS. 31(A) and 31(B), the driven portion 214c is pressed forward by the control lever 215 returning to the original position, so that the magnet plate 214 is returned to the original position. By the return of the magnet plate 214, the stopper pin 213 attracted to the permanent magnet PM is returned to the original position, and the rear end of the rod portion 213b enters the insertion hole 211b.

Figure 31:
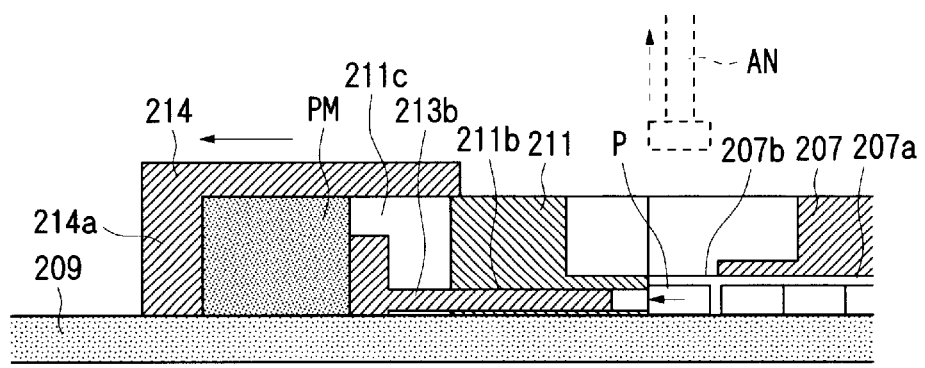
FIG. 31(A) is an enlarged longitudinal sectional view of a principal portion of the apparatus shown in FIG. 27.
FIG. 31(B) is an enlarged transverse sectional view of a principal portion of the apparatus shown in FIG. 27.
Figure 31:
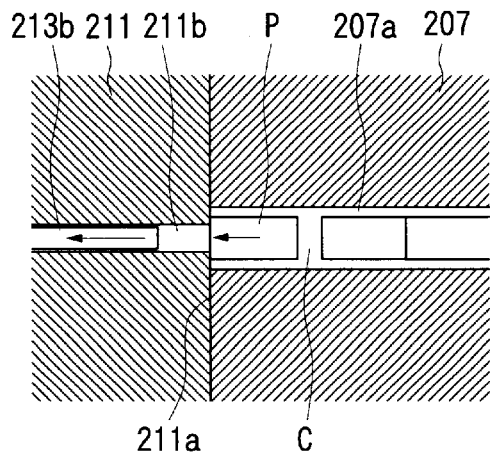

At the rear end of the rod portion 213b of the stopper pin 213, either N pole or S pole is produced by the magnetization by the permanent magnet PM. Therefore, as shown in FIGS. 31 (A) and 31 (B), when the rod portion 213b, which has projected, enters the insertion hole 211b, the foremost chip component P is moved forward together with the stopper pin 213 while maintaining a state of being attracted to the rear end of the rod portion 213b, and comes into contact with the component stop face 211a of the stopper plate 211. Thereupon, the foremost chip component P is separated from the succeeding chip component P, and a gap C is formed forcedly between the foremost chip component P and the succeeding chip component P.

As shown FIGS. 31(A), the foremost chip component P is taken out by using the suction nozzle AN in a state in which the foremost chip component P is separated from the succeeding chip component P. After the foremost chip component P is taken out by the suction nozzle AN, the same procedure as described above is repeated.

Although the permanent magnet PM is installed on the front side of the stopper pin 213 made of a magnetic material in this embodiment, a stopper pin having been magnetized in advance may be installed integrally with the stopper plate, or a stopper pin formed of a permanent magnet may be installed integrally with the stopper plate, by which the aforesaid permanent magnet PM can be eliminated.

Also, although the configuration in which the driven portion 214c of the magnet plate 214 is brought into contact with the control lever 215 has been explained, the driven portion 214c of the magnet plate 214 may be rotatably connected to the control lever 215.

Further, if the succeeding chip component P is retained when the foremost chip component P is separated from the succeeding chip component P, the succeeding chip component P can be prevented from being moved by being attracted to the foremost chip component P. FIGS. 37(A) to 37(C) show the examples. In FIG. 37(A), a retractable component retaining pin 231 is installed in the guide groove 207a to retain at least the second chip component P by pushing it against the groove inner surface or the belt surface. In FIG. 37(B), component retaining plates 232 having a springing property are disposed in the guide groove 207a in an opposed manner to retain at least the second chip component P by elastically holding it between the component retaining plates 232. In FIG. 37(C), an air hole 233 is formed in the wall of the guide groove 207a to retain at least the second chip component P by pushing it against the groove inner surface or the belt surface by a negative pressure caused by the air suction or a positive pressure caused by the air blow through the air hole 233.

FIGS. 38(A) to 38(D) show still another construction effective in separating the foremost chip component P from the succeeding chip component P. In this construction, a guide concave 211g is formed at a portion where the stopper plate 211 faces the guide groove 207a of the third component guide 207, and a stopper block 224 is disposed in the guide concave 211g so as to be movable longitudinally. Also, the stopper block 224 is formed with a through hole 224a in which the rod portion 213b of the stopper pin 213 can be inserted, and a cavity 224b having a transverse cross-sectional shape larger than that of the through hole 224a is formed at the center of the through hole 224a. On the other hand, the rod portion 213b of the stopper pin 213 is formed integrally or separately with a collar 213c capable of engaging with the front and rear walls of the cavity 224b.

As shown in FIG. 38(A), when the stopper pin 213 is moved rearward by the pressing of the control lever 215, the collar 213c of the rod portion 213b engages with the rear wall of the cavity 224b of the stopper block 224. Thereby, the stopper block 224 is moved rearward together with the stopper pin 213 and comes in contact with the front end of the third component guide 207, and the tip end of the rod portion 213b of the stopper pin 213 protrudes from the stopper block 224 toward the chip component P. The chip components P moving in one line are stopped when the foremost chip component P comes into contact with the tip end of the rod portion 213b.

When the pressure on the control lever 215 is released, as shown in FIGS. 38(B) and 38(C), the stopper pin 213 is moved forward, and the rod portion 213b of the stopper pin 213 enters the through hole 224a of the stopper block 224. Since either N pole or S pole is produced at the rear end of the rod portion 213b in the same manner as described above, the foremost chip component P is moved forward together with the rod portion 213b while maintaining a state of being attracted to the rear end of the rod portion 213b, and comes into contact with a component stop face (having no reference numeral) of the stopper block 224. Thereby, the foremost chip component P is separated from the succeeding chip component P, and a gap corresponding to the protrusion amount of the rod portion 213b is formed between the foremost chip component P and the succeeding chip component P.

Since the stopper pin 213 is moved further forward until the control lever 215 is returned to the original position, in this movement process, as shown in FIG. 38(D), the collar 213c of the rod portion 213b engages with the front wall of the cavity 224b of the stopper block 224. Thereby, the stopper block 224 is moved forward together with the stopper pin 213, and is separated from the front end of the third component guide 207 and the tip end of the foremost chip component P.

According to this construction, the stopper block 224 can be separated from the front end face of the foremost chip component P at the same time when the foremost chip component P is separated from the succeeding chip component P, so that the foremost chip component P can be made in a completely free state. Therefore, when the foremost chip component P is taken out by using the suction nozzle AN, the chip component P can surely be prevented from interfering with other portions. Needless to say, the succeeding component retaining mechanism shown in FIG. 37(A) to 37(C) can be applied to this construction.

FIGS. 39(A) to 39(D) show still another construction effective in separating the foremost chip component P from the succeeding chip component P. This construction uses the succeeding component retaining mechanism shown in FIG. 37(A), and eliminates the component attracting function by the magnetic force from the stopper pin 213 by controlling the operation timing of the belt 209, stopper pin 213, and stopper block 224.

Figure 39:
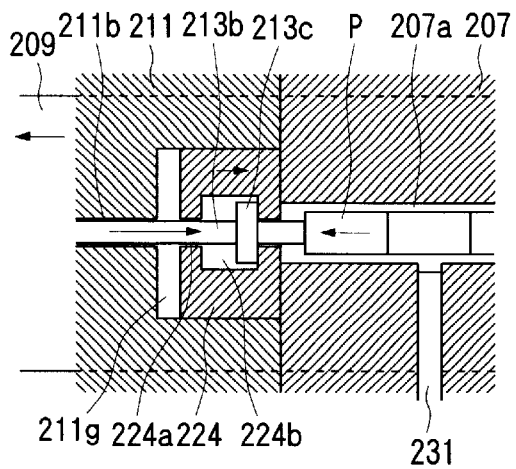
FIGS. 39 (A) to 39(D) are views showing a modified example of the apparatus shown in FIG. 38 and for illustrating a motion thereof.
Figure 39:
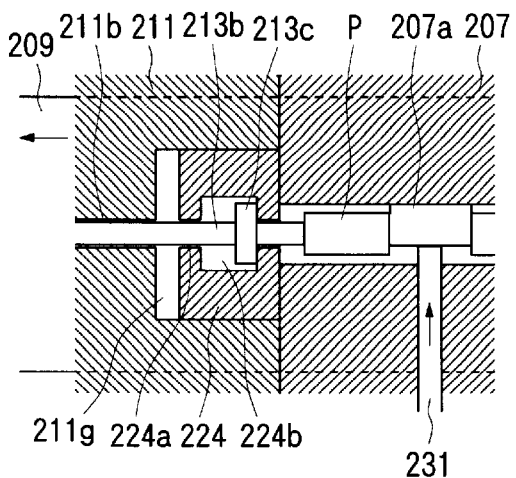
Figure 39:
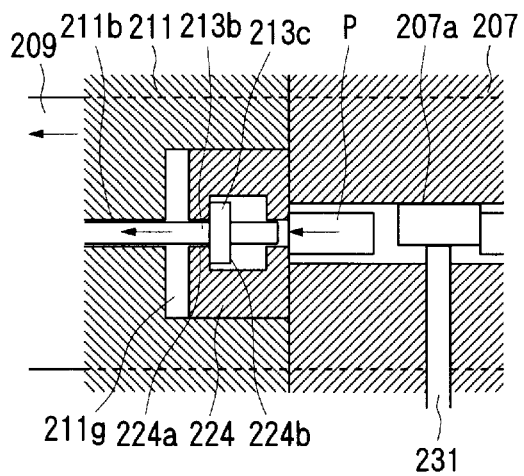
Figure 39:
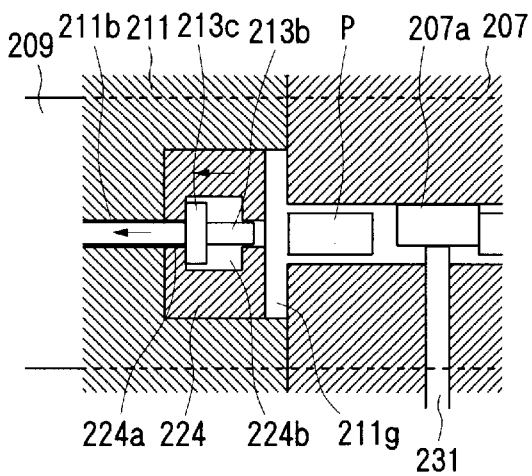

As shown in FIG. 39(A), when the stopper pin 213 is moved rearward by pressing the control lever 215, the collar 213c of the rod portion 213b engages with the rear wall of the cavity 224b of the stopper block 224. Thereby, the stopper block 224 is moved rearward together with the stopper pin 213 and comes in contact with the front end of the third component guide 207. Also, the tip end of the rod portion 213b of the stopper pin 213 protrudes from the stopper block 224 toward the chip component P. The chip components P moving in line are stopped when the foremost chip component P comes into contact with the rear end of the rod portion 213b.

When the foremost chip component P comes into contact with the rear end of the rod portion 213b, as shown in FIG. 39(B), the component retaining pin 231 is protruded in the guide groove 207a to retain the second chip component P by pressing it against the groove inner surface. At the same time, as shown in FIG. 39(C), the stopper pin 213 is moved forward so that the rod portion 213b of the stopper pin 213 enters the through hole 224a of the stopper block 224.

Since the belt 209 still advances at this time, as shown in FIG. 39(C), the foremost chip component P advances through a distance corresponding to the protrusion amount of the rod portion 213b, and comes into contact with the component stop face (having no reference numeral) of the stopper block 224. Thereupon, the belt 209 is stopped at this timing.

When the stopper pin 213 is moved further forward after the belt 209 is stopped, as shown in FIG. 39(D), the collar 213c of the rod portion 213b engages with the front wall of the cavity 224b of the stopper block 224. Thereby, the stopper block 224 is moved forward together with the stopper pin 213, so that it is separated from the front end of the third component guide 207 and the tip end of the foremost chip component P.

According to the construction shown in FIGS. 39(A) to 39(D), the stopper block 224 can be separated from the foremost chip component P at the same time when the foremost chip component P is separated from the succeeding chip component P by controlling the operation timing of the belt 209, stopper pin 213, and stopper block 224. Therefore, even if the stopper pin 213 has no component attracting function, in other words, even if no permanent magnet PM is installed on the front side of the stopper pin 213, or no stopper pin made of a magnet is used, the foremost chip component P can be made in a completely free state.

The preferred embodiment described herein are therefore illustrative and not restrictive, the scope of the invention being indicated by the appended claims and all variations which come within the meaning of the claims are intended to be embraced therein.

What is claimed is:

1. An electronic component feeding apparatus for separating a foremost electronic component conveyed to a predetermined takeout position from a succeeding electronic component, comprising:

a first component stopper disposed at a predetermined position of a component conveying passage;

a second component stopper capable of projecting from said first component stopper and having a component attracting force at least at the tip end thereof; and a stopper driving mechanism for protruding said second component stopper from said first component stopper so that the foremost electronic component comes into contact with the tip end of said second component stopper when the electronic component is moved toward said first component stopper, and for retracting said second component stopper in said first component stopper so that the foremost electronic component comes into contact with said first component stopper while the component movement is stopped.

2. The apparatus according to claim 1, wherein said second component stopper is formed of a magnetic material, and a magnetic force generating member being on the non-projecting side.

3. The apparatus according to claim 1, wherein at least a projecting end of said second component stopper is composed of a magnetic force generating member.

* * * * *